United States Patent
Hafezi et al.

(10) Patent No.: US 7,846,306 B2
(45) Date of Patent: Dec. 7, 2010

(54) APPARATUS AND METHOD FOR IMPROVING UNIFORMITY IN ELECTROPLATING

(75) Inventors: Hooman Hafezi, Redwood City, CA (US); Aron Rosenfeld, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1259 days.

(21) Appl. No.: 11/362,433

(22) Filed: Feb. 24, 2006

(65) Prior Publication Data

US 2006/0201814 A1 Sep. 14, 2006

Related U.S. Application Data

(60) Provisional application No. 60/656,161, filed on Feb. 25, 2005, provisional application No. 60/687,404, filed on Jun. 3, 2005.

(51) Int. Cl.
*G01N 27/403* (2006.01)
*C25D 17/00* (2006.01)

(52) U.S. Cl. .................................. 204/230.7
(58) Field of Classification Search ............... 205/80; 204/193, 194, 428
See application file for complete search history.

(56) References Cited

U.S. PATENT DOCUMENTS

| | | |
|---|---|---|
| 6,004,440 A | 12/1999 | Hanson et al. |
| 6,228,232 B1 | 5/2001 | Woodruff et al. |
| 6,270,647 B1 | 8/2001 | Graham et al. |
| 6,500,324 B1 * | 12/2002 | Simpson et al. ............. 205/96 |
| 6,582,578 B1 | 6/2003 | Dordi et al. |
| 6,589,401 B1 * | 7/2003 | Patton et al. ............. 204/212 |
| 6,837,978 B1 | 1/2005 | Hey et al. |
| 2002/0046952 A1 * | 4/2002 | Graham et al. ............. 205/99 |
| 2002/0125140 A1 | 9/2002 | Uzoh et al. |
| 2003/0079995 A1 | 5/2003 | Contolini et al. |
| 2003/0168344 A1 * | 9/2003 | Mavliev ............. 205/133 |
| 2003/0201184 A1 | 10/2003 | Dordi et al. |
| 2004/0226826 A1 | 11/2004 | Cheng et al. |

OTHER PUBLICATIONS

Frackowiak, et al article. "Carbon Materials for the Electrochemical Storage of Energy in Capacitors", Carbon 39 (2001) pp. 937-950.
Yang, et al article. "Electrosorption Capacitance of Nanostructured Carbon Aerogel Obtained by Cyclic Voltammetry", Journal of Electroanalytical Chemistry 540 (2003), pp. 159-167.

* cited by examiner

*Primary Examiner*—Harry D Wilkins, III
*Assistant Examiner*—Zulmariam Mendez
(74) *Attorney, Agent, or Firm*—Patterson & Sheridan, LLP

(57) ABSTRACT

A method and apparatus for plating a metal onto a substrate. One embodiment of the present invention provides an apparatus for electroplating a substrate. The apparatus comprises a fluid basin, an anode disposed near a bottom of the fluid basin, a restrictor disposed above the anode, and a substrate support member configured to move the substrate within the fluid basin among different elevations relative to the restrictor. Plating profiles on the substrate may be adjusted by changing the elevation of the substrate during plating.

3 Claims, 12 Drawing Sheets

APPARATUS AND METHOD FOR IMPROVING UNIFORMITY IN ELECTROPLATING

CROSS-REFERENCE TO RELATED APPLICATIONS

This application claims benefit of U.S. Provisional Patent Application Ser. No. 60/656,161 filed Feb. 25, 2005 and U.S. Provisional Patent Application Ser. No. 60/687,404 filed Jun. 3, 2005, which are herein incorporated by reference.

BACKGROUND OF THE INVENTION

1. Field of the Invention

Embodiments of the invention generally relate to methods and apparatus for electrochemical processing. One embodiment of the invention relates to an electrochemical processing cell configured to have an electric field with different profiles at different locations.

2. Description of the Related Art

Metallization of high aspect ratio 90 nm and smaller sized features is a foundational technology for future generations of integrated circuit manufacturing processes. Metallization of these features is generally accomplished via an electrochemical plating process. In a typical process scheme, a metal, such as copper, is plated onto a substrate comprising an array of integrated circuit devices with open vias and trenches. The plating process is carried out in such a manner as to fill the vias and trenches on the substrate surface with metal and to further deposit an additional amount of metal known as the overburden on the substrate. The overburden is required to enable subsequent polishing and planarization of the deposit through a process step such as chemical mechanical polishing. The total amount of metal deposited in the electrochemical plating process is typically 0.2 to 1 µm.

However, electrochemical plating (ECP) of these features presents several challenges to conventional gap fill methods and apparatuses. One such problem, for example, is that electrochemical plating processes generally require a conductive seed layer to be deposited onto the features to support the subsequent plating process. Conventionally, these seed layers have had a thickness of between about 1000 Å and about 2500 Å; however, as a result of the high aspect ratios of 90 nm features, seed layer thicknesses must be reduced to less than about 500 Å, or even below 100 Å. This reduction in the seed layer thickness increases resistivity of the substrate causing a "terminal effect," which is an increase in the deposition thickness near the perimeter of the substrate being plated.

The terminal effect is most severe at the beginning of an electrochemical plating process, for example, within about the first 10 seconds of the electrochemical plating process, when the substrate resistivity is at the highest level. This stage is also the critical stage when the features on the substrates are being filled. The terminal effect results in a large difference in the plating rate across the substrate, leading to variations in film properties such as film composition and resistivity between the center and edge of the substrate. More importantly, a highly non-uniform plating rate across the substrate during the filling of features forces the features at either the center or edge of the wafer to fill under sub-optimal conditions, resulting in problems, such as incomplete filling and trapped voids inside the features.

Additionally, it is often desirable to modulate the plating rate at the edge of the substrate after the features have been filled and while the overburden is being deposited. For example, processes that follow electrochemical plating, such as chemical mechanical polishing, may yield better performance if the plated film is thinner at the edge than at the center of the wafer. This is because certain polishing processes are edge-slow (edge fast), so that a slightly edge-thin (edge thick) deposit profile after plating results in an optimally uniform profile after polishing.

Therefore, control of the plating rate at the edge of the substrate is desired to mitigate the terminal effect and adjust the overall plating profile. Attempts have been made modulate the plating profile at the edge of the substrate through various apparatus and methods. For example, Conventional plating cells have been modified to include resistive elements, multi-segment anodes, or passive shield or flange members. These configurations were only partly successful because of their lack of proximity to the perimeter of the substrate or inability to dynamically adjust the profile. For example, resistive elements or passive shield or flange members were only sufficient to generate one type of plating profile, such as uniform or edge-thin, whereas future generations of plating processes may require both types of profiles to be available during the plating process.

Therefore, there exists a need for an apparatus and method for minimizing terminal effect and/or adjusting plating profile dynamically.

SUMMARY OF THE INVENTION

Embodiments of the present invention provide apparatus and method for minimizing terminal effect and adjusting plating profiles.

One embodiment of the present invention provides an apparatus for electroplating a substrate. The apparatus comprises a fluid basin, an anode disposed near a bottom of the fluid basin, a restrictor disposed above the anode, and a substrate support member configured to move the substrate within the fluid basin among different elevations relative to the restrictor.

Another embodiment of the present invention provides an apparatus for electroplating a substrate. The apparatus comprises a fluid basin configured to retain a plating solution in a fluid volume therein, an anode disposed on a bottom of the fluid basin, a substrate support member configured to position the substrate in the fluid basin along a trajectory, wherein the fluid volume has a restricted section with an inner diameter smaller than the diameter of the substrate.

Yet another embodiment of the present invention provides a method for plating a metal onto a substrate. The method comprises moving the substrate in a plating solution to adjust a plating current distribution across the substrate. The method further comprises providing a plating cell having a plating solution retained in a fluid volume, wherein the fluid volume has a restricted section having a smaller sectional area than a plating surface on the substrate, providing an anode on one side of the restricted section, positioning the substrate in a first position, wherein the substrate and the anode are on opposite sides of the restricted section, and applying a first electric bias between the substrate and the anode.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 9B illustrates a sectional view of an electrochemical plating cell having a diffuser plate with restricted area for fluid to pass through.

DETAILED DESCRIPTION OF THE PREFERRED EMBODIMENT

The present invention generally provides an electrochemical plating cell, with an encased auxiliary electrode assembly in fluid communication with the cathode compartment, configured to uniformly plate metal onto a substrate.

Figure 1A:
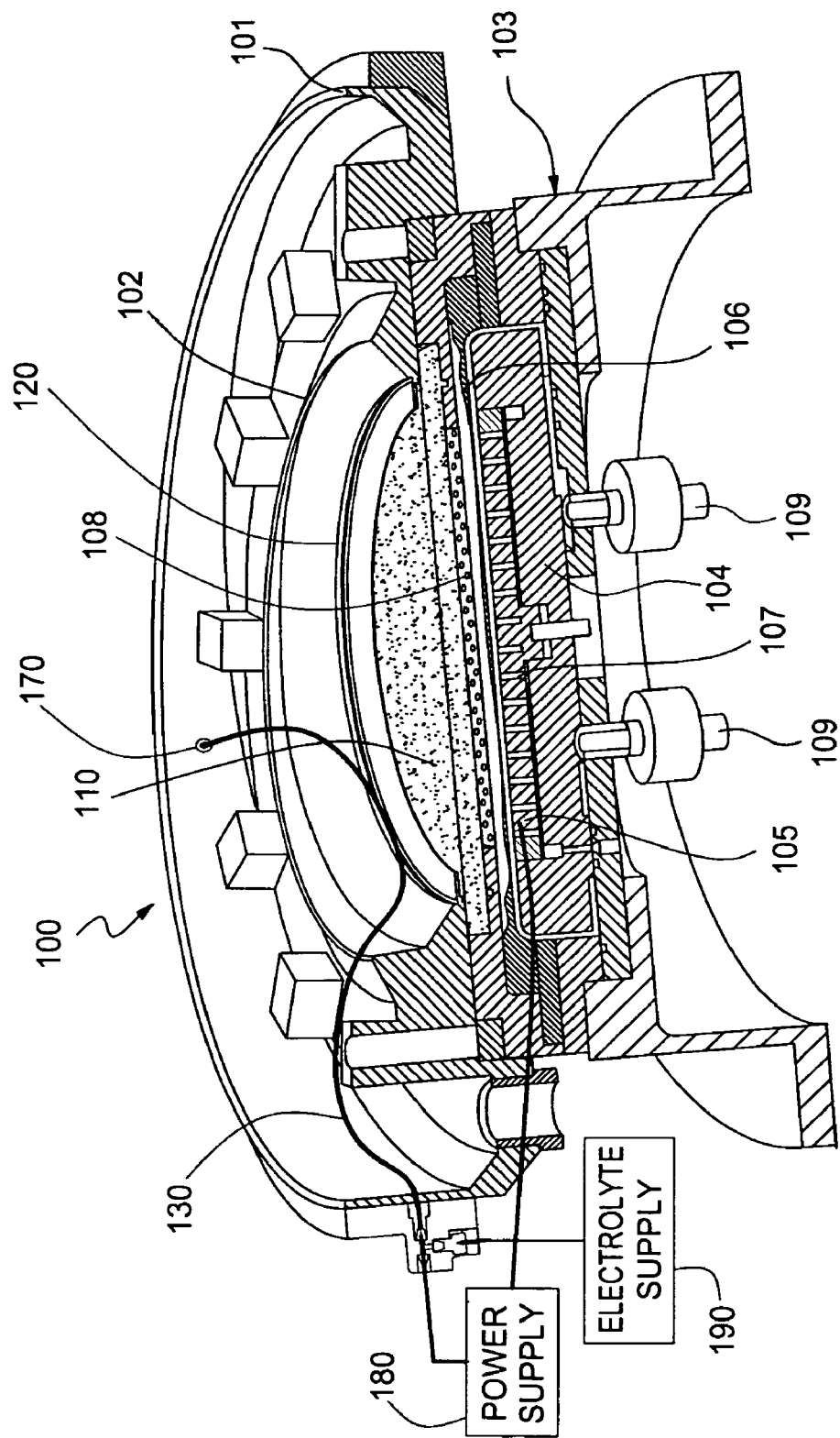
FIG. 1A illustrates a partial sectional perspective view of an exemplary electrochemical plating cell of the invention.

FIG. 1A illustrates a partial sectional perspective view of an exemplary electrochemical plating cell 100 containing an encased auxiliary electrode assembly 130 of the invention. The encased auxiliary electrode assembly 130 is composed of an auxiliary electrode 132 surrounded by electrolyte in a protective tube 134. In another embodiment, the electrolyte is absent and the protective tube is attached directly to the surface of the auxiliary electrode. The encased auxiliary electrode assembly 130 is generally configured to be used as a cathode when the substrate contacts (not shown) are configured as cathodes. Also, when configured as a cathode, the encased auxiliary electrode assembly 130 can be used (when the substrate contacts are configured as anodes) as a cathode for deplating copper that accumulates on the substrate contacts. The protective tube 134 of the encased auxiliary electrode assembly 130 prevents catholyte solution organics from entering the encased auxiliary electrode assembly 130 while also preventing copper sludge and plated copper formed at the encased auxiliary electrode assembly 130 from exiting the protective tube 134 and contaminating the catholyte solution.

The encased auxiliary electrode assembly 130 includes an auxiliary electrode 132 is preferably platinum but may be manufactured from copper or other metals known to be effective as either a soluble or insoluble electrode in an electrochemical plating cell. Additionally, the auxiliary electrode 132 may be manufactured from a core material, such as copper, stainless steel, titanium, or other cost effective core electrode material, and then the outer surfaces, i.e., the upper surface of the auxiliary electrode 132 that is in fluid contact with the electrolyte, may then be plated with another metal, such as platinum, titanium, or other electrode material. This configuration allows the cost of auxiliary electrode 132 to be reduced, as a more cost effective and electrically conductive material is used to manufacture the core of the auxiliary electrode 132, while another more costly but desirable electrode material, i.e., platinum, is used for the exposed surfaces of the auxiliary electrode 132. The auxiliary electrode 132 can be a wire, a ring, a torroid or of other shape.

Due to the proximity of the auxiliary electrode 132 to the primary cathode (the contact ring, pins and substrate) a large amount of copper sludge is generated at the auxiliary electrode 132. The protective tube 134 prevents this copper sludge from exiting the encased auxiliary electrode assembly 130 and contaminating the catholyte solution. Further, the protective tube 134 prevents the auxiliary electrode 132 from consuming and degrading the organic additives (levelers, suppressors and activators) in the catholyte solution. Preferably, the protective tube 134 can be composed of an ion exchange material such as Nafion®, CMX-SB or Vicor membrane. Also, the protective tube 134 can be composed of a porous membrane. One example of a hydrophilic porous membrane is the Durapore Hydrophilic Membrane, available from Millipore Corporation, located in Bedford, Mass. Other examples of conventional membranes include porous glass, porous ceramics, silica aerogels, organic aerogels, porous polymeric materials, and filter membranes. Specific membranes include carbon filter layers, Kynar polymer layers or polypropylene membranes.

When in a plating configuration, the protective tube 134 allows copper ions to plate onto the auxiliary electrode 132 but does not allow the copper sludge to exit the protective tube and contaminate the catholyte solution, and as such, protective tube 134 is generally an ionic or ion exchange-type membrane. Ion exchange membranes generally include fixed negatively charged groups, such as $SO_3^-$, $COO^-$, $HPO_2^-$, $SeO_3^-$, $PO_3^{2-}$, or other negatively charged groups amenable to plating processes. As such, the protective tube 134 is configured to allow a particular type of ion to travel through the membrane, while preventing other types of ions from traveling or passing through the membrane. More particularly, the protective tube 134 may be a cationic membrane that is configured to allow positively charged copper ions ($Cu^{2+}$ and $H^+$) to pass therethrough, i.e., to allow copper ions to travel from the catholyte solution through the protective tube 104 where the copper ions may then be plated onto the auxiliary electrode 132. Further, the cationic membrane may be configured to prevent passage of negatively charged ions and electrically neutral species in the solution, such as the ions that make up the plating solution and catholyte additives. It is desirable to prevent these catholyte additives from traveling through the protective tube 134 and contacting the auxiliary electrode 132, as the additives are known to breakdown upon contacting the auxiliary electrode 132. More particularly, membranes with negatively charged ion groups like $SO_3^-$ etc. not only operate to facilitate Cu ion transport from the anolyte to the catholyte, but also to prevent penetration of accelerators to the auxiliary electrode. The accelerators are generally negatively charged organic ions, such as, for example, $^-SO_3^-$—$C_3H_6$—S—S—$C_3H_6^-SO_3^-$, so they can't penetrate into or through the cation membrane and contact the auxiliary electrode where they are consumed and/or depleted.

Protrective tube 134, for example, may be a Nafion® membrane manufactured by Dupont Corporation. Nafion® membrane is an example of a poly (tetrafluoroethylene) based ionomer. Nafion® membrane has several desirable characteristics for electrochemical plating applications, such as its thermal and chemical resistance, ion-exchange properties, selectivity, mechanical strength, and insolubility in water. Nafion® membrane is also a cationic membrane based on a fluorized polymer matrix. Because of its fluorized matrix, Nafion® membrane exhibits excellent chemical stability, even in concentrated basic solutions. More particularly, Nafion® membrane is a perfluorinated polymer that contains small proportions of sulfonic or carboxylic ionic functional groups, and has been shown to be effective in transmitting metal ions (copper ions in the present embodiment) therethrough, even at low plating current densities. Specifically, Nafion® membranes have shown to be effective at transmitting between about 93% and about 97% of copper ions therethrough at plating current densities of between about 5 mA/cm$^2$ and about 20 mA/cm$^2$. Additionally, at current densities of between about 20 mA/cm$^2$ and about 60 mA/cm$^2$, Nafion® membrane transmits between about 97% and about 93% of copper ions therethrough. The above noted transmission percentages were observed using a copper sulfate solution having a pH value of about 3.4. Nafion's® general chemical structure (illustrated below as Diagram 1), illustrates where X is either a sulfonic or carboxylic functional group and M is either a metal cation in the neutralized form or an H$^+$ in the acid form.

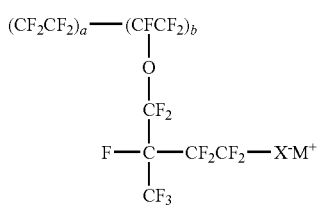

Diagram 1

As a result of electrostatic interactions, the ionic groups that form Nafion® membrane tend to aggregate to form tightly packed regions referred to as clusters. The presence of these electrostatic interactions between the ions and the ion pairs enhance the intermolecular forces and thereby exert a significant effect on the properties of the parent polymer, which makes Nafion® membrane, or other membranes having similar physical and/or operational characteristics, a desirable ionic membrane for use in electrochemical plating cells having separated anolyte and catholyte chambers.

Other membranes that may be used in embodiments of the invention include various cationic and anionic membranes. For example, ionic membranes manufactured by Tokuyama of Japan, i.e., CMX-SB ionic membranes that are based on a polydivinilbenzol matrix, may be used to isolate a catholyte solution from an anolyte solution in an electrochemical plating cell. CMX-SB membranes have been shown to be effective in transmitting copper ions while preventing organic plating additives from transmitting therethrough.

Additionally, CMX-SB membranes have shown acceptable resistance to transmission of positive hydrogen ions. More particularly, CMX membranes have been shown to transmit above about 92% of copper ions at a current density of about 10 mA/cm$^2$, and above about 98% at a current density of about 60 mA/cm$^2$. Ionics CR-type membranes from Ionics Inc. have also shown to be able to transmit above about 92% of copper ions at about 10 mA/cm$^2$ and above about 88% of copper ions at about 60 mA/cm$^2$.

With regard to other properties of the above noted membranes (Ionics, CMX, and Nafion® membrane), each exhibit relatively high conductivity, i.e., about 41.2, 35.3, and 24.2 ohm cm$^2$ at 10 mA/cm$^2$ for Ionics, Neosepta and Nafion® membrane, respectively. Additionally, water moves through the membranes from the anolyte into the catholyte compartment. This effect essentially dilutes the catholyte and is undesirable. For example, between about 0.5 and about 3 liters of water penetrates into the catholyte per 24 hours (or per 200 wafers) depending on the membrane type and electrolysis conditions. For example, CMX shows the minimal water transport at about 1.5 ml/wafer, the Ionics membrane shows about 5 ml/wafer, and Nafion® membrane shows about 6.5 ml/wafer. The transport properties of the CMX and Nafion® membranes result in the CuSO$_4$/H$_2$SO$_4$ concentration ratio remaining relatively constant, even after about 200 substrates are plated. This indicates that copper acid concentration changes will be lower than 2%, if the penetrated water will be removed, e.g., by enforced evaporation. As such, the use of CMX or Nafion® membrane requires only a small device to accelerate the water evaporation to 4-6 liters/day. However, Ionics membranes require an additional device that extracts the excess of H$_2$SO$_4$ coming from the anolyte. Table 1 illustrates the respective properties of the above noted membranes.

Vicor membranes may also be used to advantage in the plating cell of the invention. Other membranes that may be used in the plating cell of the invention include Neosepta® membranes (ionic and non-ionic) manufactured by Tokuyama, Aciplex® membranes, Selemlon® membranes, and Flemion membranes (all of which are available as ionic and non-ionic) from Asahi Corporation, Raipare™ membranes from Pall Gellman Sciences Corporation, and C-class membranes from Solvay Corporation.

Referring to FIG. 1A, the auxiliary electrode 132 is in electrical communication with a power supply 190 that is configured to electrically bias the auxiliary electrode 132 anodically or cathodically, i.e., the auxiliary electrode 132 may be biased cathodically to assist in controlling the plating uniformity during the plating process which essentially supplements or adds to the fields generated by the primary cathode of the plating cell or to deplate metal from the contact pins that conduct the plating bias to the substrate in the plating cell when the primary cathode is biased anodically. As such, the auxiliary electrode 132 may be used to either withdraw some of the electrical field directed to the primary cathode or to deplate the contact pins of the substrate contact ring when the primary cathode is biased as an anode.

TABLE I

| Membrane | Cu$^{2+}$ transfer, % | Water transfer, ml/Amphr | Resistance ohm cm2 | Cu/Acid Ratio Deviation, % |
|---|---|---|---|---|
| Ionics | 90-95 | 8-11.5 | 53 | 4% |
| Nafion | 95-98 | 4-7.5 | 36 | 2% |
| CMX | 97-98 | 5.0-3.1 | 47 | 1% |

In operation the auxiliary electrode 132 may be cathodically biased in order to deplate copper that accumulates on substrate contacts used to communicate a plating bias to a substrate during plating operations. As is known in the art, copper tends to build up on the electrical substrate contacts (as a result of the contacts being in communication with the plating solution during the plating process) and may cause varying resistances between the respective contacts and the substrates being plated, which often results in uniformity variations between plated substrates. As such, it is desirable to periodically remove the accumulated copper from the substrate contacts so that plating uniformity between substrates may be maximized. The removal processes is generally conducted at a time period when no substrates are being plated, i.e., between plating substrates. At this time a substrate contact ring (or other apparatus that includes the elements used to electrically contact the substrate during the plating process) is immersed in the plating solution such that the electrical contact pins are in fluid communication with the plating solution. Once immersed, a deplating bias is applied between the contact pins and the auxiliary electrode 132. More particularly, the deplating bias is configured such that the auxiliary electrode 132 is the cathode electrode and the substrate contact pins are the anodic electrodes. In this configuration the substrate contact pins supply the copper ions to the reduction reaction, and as such, the copper that was plated onto the contact pins during plating operations is removed from the contact pins, transported through the plating solution, and deposited on the auxiliary electrode 132 in the reduction process resulting from the application of the deplating bias. The deplating bias may be between about 3 volts and about 7 volts, for example, and may have a duration of between about 10 seconds and about 30 seconds. Additionally, the deplating time may be increased to above 30 seconds if the time between deplating processes is long, i.e., if the number of substrates plated has been excessive and the copper buildup on the contact pins is more than can be removed in 30 seconds. In this situation the deplating time or duration may be calculated as 20 seconds multiplied by the number of substrates plated since the last deplating process. Thus, for example, if 20 substrates have been plated since the last contact pin deplating process, then the duration of the deplating process may be about 400 seconds to remove the excessive accumulation of copper on the contact pins. Embodiments of the invention contemplate that the contact pins may be deplated between every substrate that is plated in order to maximize uniformity and throughput. In this configuration the deplating process will likely have a duration of less than about 20 seconds. However, the inventors have found that the deplating process may be extended to between every second, third, or fourth plated substrate without a substantial degradation in the uniformity. In this configuration the deplating time may be between about 20 seconds and about 80 seconds, for example.

The copper ions that deposit or accumulate on the auxiliary electrode 132 during the deplating process generally do not have an effect upon plating uniformity. However, copper deposits plated onto the auxiliary electrode 132 as a result of the plating or deplating process may later be reintroduced into the plating bath via application of a forward plating bias to the auxiliary electrode 132 (along with the plating anode 105) during a plating process. This configuration essentially configures the auxiliary electrode 132 as a secondary or auxiliary anode to the primary plating anode 105, and as such, when the forward plating bias is applied to the electrodes (the plating anode 105 and the auxiliary electrode 132), the copper ions that have plated onto auxiliary electrode 132 will be removed from the auxiliary electrode 132 via the reduction reaction that supports the plating process and reintroduced into the plating solution. More particularly, the auxiliary electrode 132 may be electrically biased during plating operations to the same polarity as the anode 105, and as such, the auxiliary electrode 132 may contribute to the plating reaction, i.e., supply copper ions to the plating solution, as well as generating a magnetic and/or electric field in the plating cell. More particularly, since the auxiliary electrode 132 is positioned radially outward of the substrate perimeter being plated, the electric field from the auxiliary electrode 132 may be used to provide an additional element of control over plating uniformity across the surface of the substrate as a result of the field effect of the auxiliary electrode 132. The minimal current supplied to the auxiliary electrode 132 during the plating process may be calculated to generate an electric field sufficient to interact with the substrate and/or the minimal current may be calculated to generate a shaping field, i.e., the field generated by auxiliary electrode 132 (which has a small magnitude) may primarily be used to shape the field generated by the anode 105 (which has a much larger magnitude, as the majority of the plating current is traveling through the anode 105). Alternatively, auxiliary electrode 132 may be electrically biased to the same electrical potential as the primary anode 105. In this configuration the anode 105 and the auxiliary electrode 132 essentially operate as a unitary anode.

Additional embodiments of the invention contemplate that the auxiliary electrode 132 may be active (have a forward or plating bias applied thereto) for either the entire plating process time (the time when the primary anode is active) or for only a portion of the plating process. In embodiments where the auxiliary electrode 132 is active for only a portion of the plating process duration, the auxiliary electrode 132 may be activated for a time period that is calculated to remove the copper deposits therefrom. For example, if the auxiliary electrode 132 is activated for 20 seconds during the deplating process, then the auxiliary electrode 132 may be activated for another 20 seconds during the plating process. The effect of this configuration would be to clean the auxiliary electrode, ie., to redeposit the copper that was plated onto the auxiliary electrode during the deplating process into the electrolyte solution, assuming that equal power is applied during both the deplating and plating steps.

Referring to FIG. 1A, the plating cell 100 further includes an outer basin 101 and an inner basin 102 positioned within outer basin 101. The encased auxiliary electrode assembly 130 is positioned in a groove 120 located in the lower portion of the inner basin 102 of the plating cell. The inner basin 102 is generally configured to contain a plating solution that is used to plate a metal, e.g., copper, onto a substrate during an electrochemical plating process. During the plating process, the plating solution is generally continuously supplied to the inner basin 102 (at about 1 gallon per minute for a plating cell having a 10 liter total capacity (capacity generally includes the cell volume and the supply tank), for example), and therefore, the plating solution continually overflows the uppermost point of the inner basin 102 and runs into the outer basin 101. The overflow plating solution is then collected by the outer basin 101 and drained therefrom for recirculation into the inner basin 102. As illustrated in FIG. 1, plating cell 100 is generally positioned at a tilt angle, i.e., a frame portion 103 of the plating cell 100 is generally elevated on one side such that the components of plating cell 100 are tilted between about 3° and about 30°. Therefore, in order to contain an adequate depth of plating solution within inner basin 102 during plating operations, the uppermost portion of inner basin 102 may be extended upward on one side of plating cell 100, such that the uppermost point of inner basin 102 is generally horizontal and allows for contiguous overflow of the plating solution supplied thereto around the perimeter of inner basin 102.

Figure 1D:
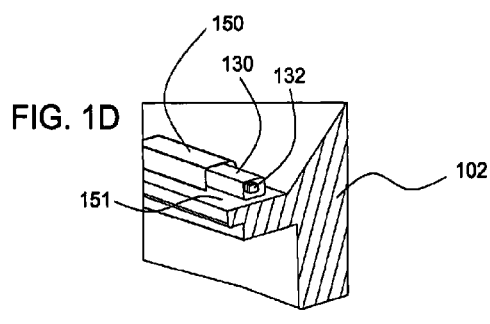
FIG. 1D illustrates an alternate placement of the encased auxiliary electrode assembly.
Figure 1B:
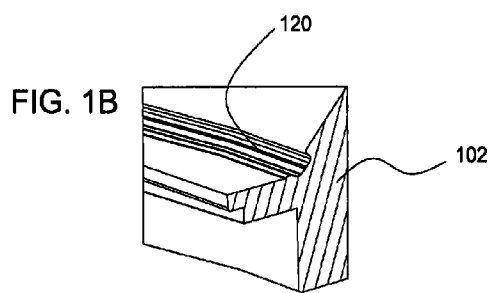
FIG. 1B illustrates an enlarged partial perspective view of the groove displayed in FIG. 1A in which the encased auxiliary electrode is placed.

FIG. 1B illustrates an enlarged partial perspective sectional view of the lower portion of the inner basin 102 containing the groove 120 where the encased auxiliary electrode assembly 130 is placed.

Figure 1C:
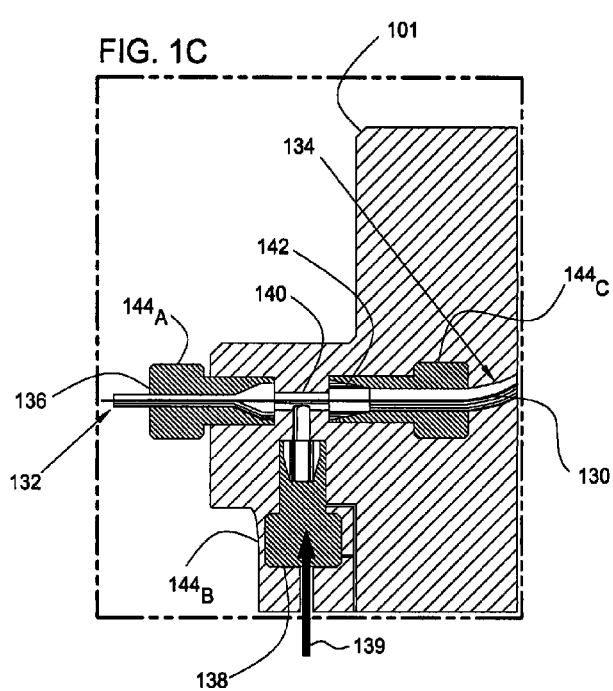
FIG. 1C illustrates an enlarged view of the wall of the outer basin of the plating cell displayed in FIG. 1A showing how the encased auxiliary electrode assembly enters the basin of the plating cell.

FIG. 1C illustrates an enlarged view of the outer basin 101 of the plating cell 100 displayed in FIG. 1A showing how the encased auxiliary electrode assembly 130 enters the electrochemical the plating cell 100 through a T-connection 140. After traversing the outer basin 101 of the plating cell 100, the encased auxiliary electrode assembly 130 circumnavigates the plating cell within the groove 120 and exits at an outlet 170. Upon entering T-connection 140, the auxiliary electrode 132 is combined with electrolyte from an electrolyte source 190 and enters the protective tube 134 to form the encased auxiliary electrode assembly 130. The T-connection 140 is shown with an electrode inlet 136, an electrolyte inlet 138 and an outlet 142 where the encased auxiliary electrode assembly 130 traverses the wall of the outer basin 101 of the plating cell. The electrode inlet 136, electrolyte inlet 138 and electrode assembly outlet 142 are sealed in a well known manner with seals 144a, 144b and 144c respectively.

The electrolyte, shown by an arrow 139 entering through the electrolyte inlet 138, is generally an anolyte and is kept separate from a catholyte in the catholyte compartment. The anolyte in the protective tube 134 can either be flowing or stagnant. There are several advantages to using anolyte in the encased auxiliary electrode assembly 130. First, anolyte does not contain catholyte organics (levelors, suppresors, and activators) which may be quickly consumed or degraded by the auxiliary electrode 132. Second, the use of anolyte is more cost effective than catholyte but still provides the desired conduction. In another embodiment (not shown) the protective membrane adheres directly to the upper surface of the auxiliary electrode and functions without electrolyte.

FIG. 1D illustrates an additional embodiment of the enlarged partial perspective sectional view of the lower portion of the inner basin 102 containing the encased auxiliary electrode assembly 130. The encased auxiliary electrode assembly 130 is positioned between an upper surface 151 of the inner basin 102 and a support member 150. The support member 150 is fastened to the upper surface 151 of the inner basin 102 thus securing the encased auxiliary electrode assembly 130 to the upper surface 151 of the inner basin 102 while also allowing for expansion of the protective tube 134. The support member 150 and upper surface 151 of the inner basin are welded together, bolted together or fastened using other conventional means.

Figure 2:
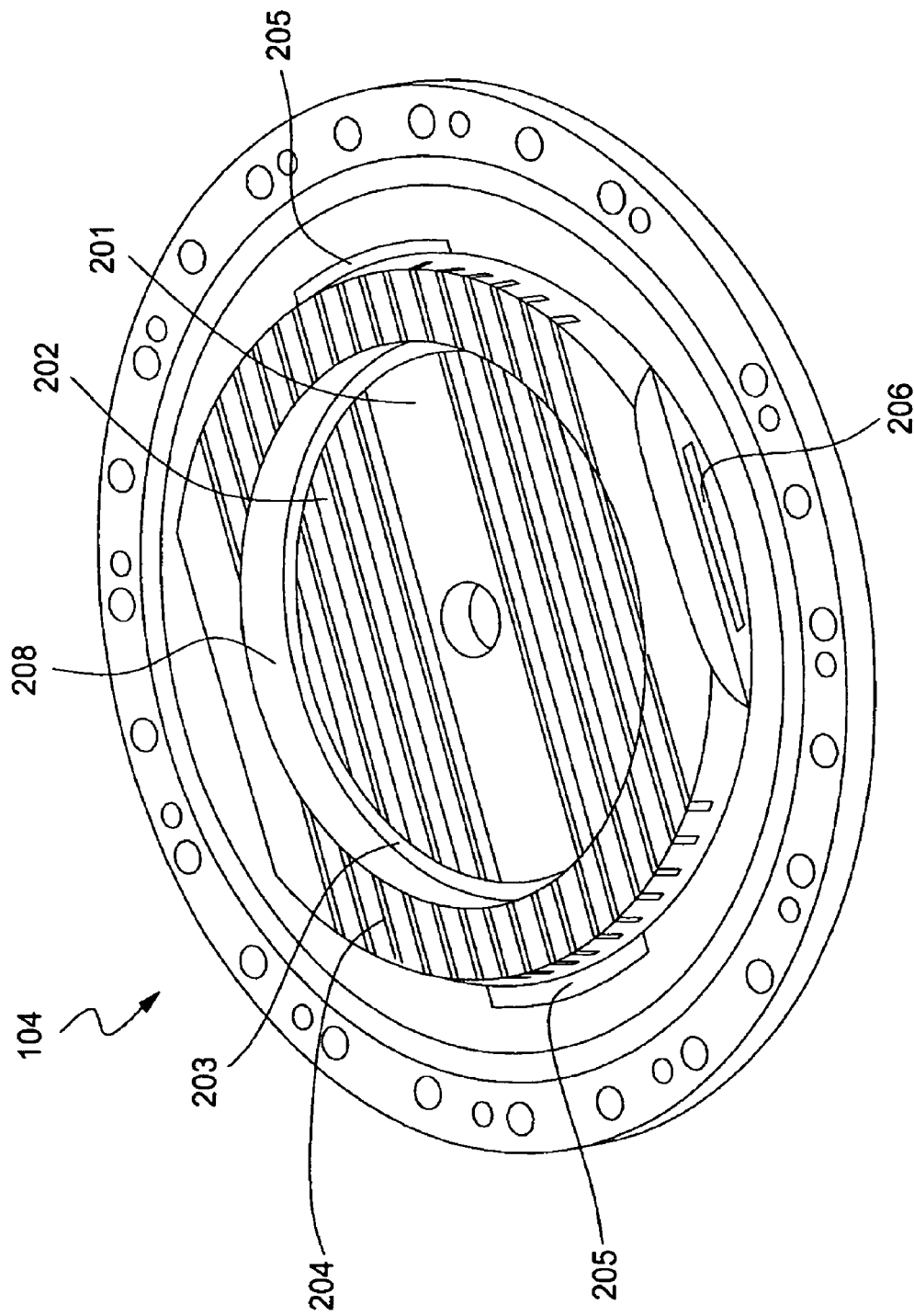
FIG. 2 illustrates a perspective view of an anode base plate of the invention.

FIG. 2 illustrates a perspective view of the anode base member 104 without the anode 105. The upper surface of base member 104 generally includes an annular recessed portion 201 defined by a vertical wall 208 and configured to receive a disk shaped anode 105 therein. Further, the bottom surface of annular recessed portion 201 generally includes a plurality of anode base channels 202 formed therein. Each of anode base channels 202 are generally positioned in parallel orientation with each other, extend across the lower portion of the recessed portion 201, and terminate at the periphery of recessed region 201. Additionally, the periphery of recessed region 201 includes an annular drain channel 203 that extends around the perimeter of recessed portion 201. Each of the plurality of parallel positioned anode base channels 202 terminate at opposing ends into annular drain channel 203. Therefore, anode base channels 202 may receive dense fluids from anode channels 107 (further discussed herein) and transmit the dense fluids to drain channel 203 via anode base channels 202. The vertical wall 208 that partially defines recessed portion 201 generally includes a plurality of anode base slots 204 formed into the vertical wall 208. The anode base slots 204 are generally positioned in parallel orientation with each other, and further, are generally positioned in parallel orientation with the plurality of anode base channels 202 formed into the bottom surface of recessed portion 201. The base member 104 also includes at least one fluid supply conduit 205 configured to dispense a fluid into an anode region of the plating cell 100, along with at least one plating solution supply conduit 206 that is configured to dispense a plating solution into the cathode compartment of plating cell 100. The respective supply conduits 205 and 206 are generally in fluid communication with at least one fluid supply inlet/drain 109 (illustrated in FIG. 1A) positioned on a lower surface of the base member 104.

Figure 3:
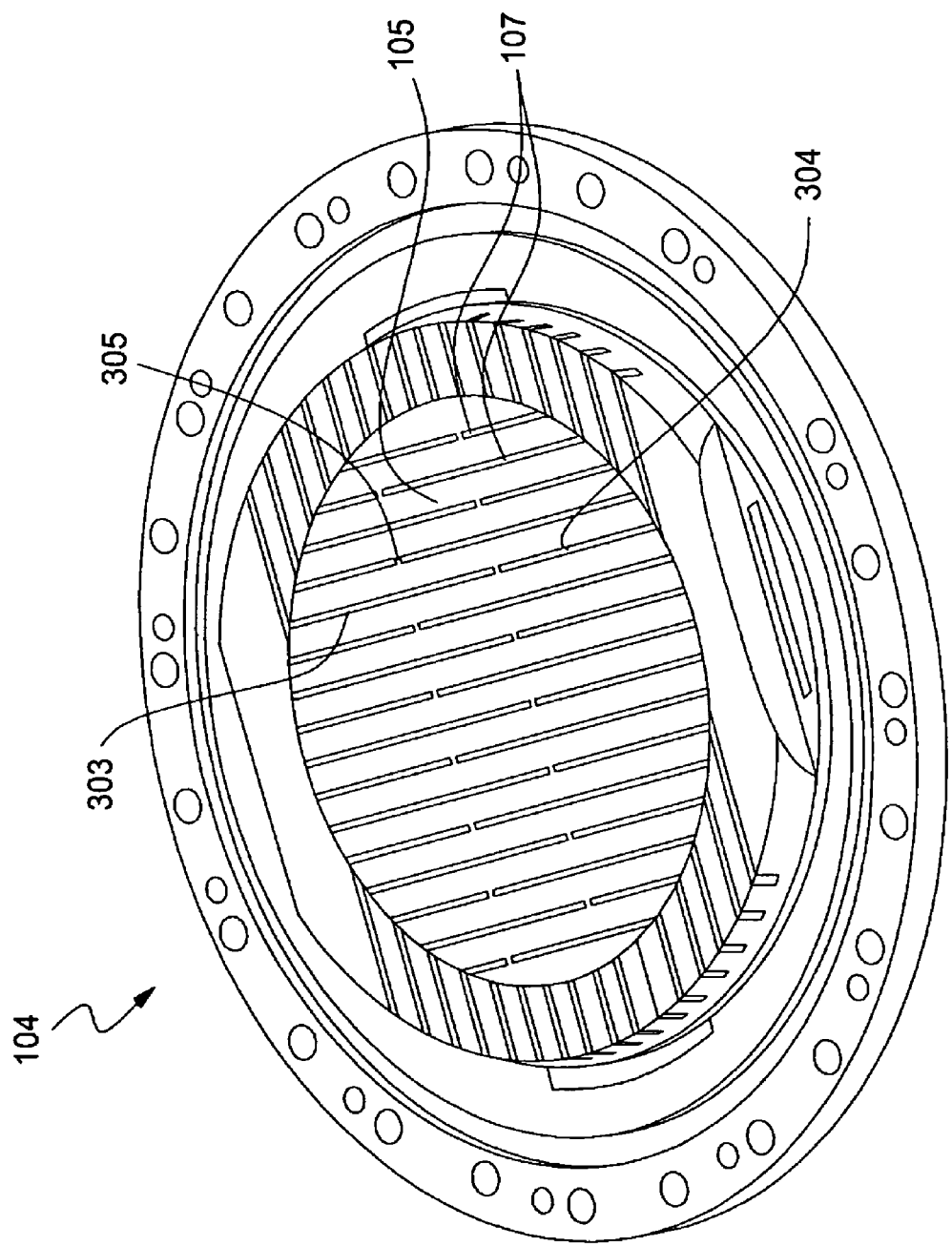
FIG. 3 illustrates a perspective view of an exemplary anode base plate of the invention having an anode positioned therein.

FIG. 3 illustrates a perspective view of the base member 104 having the disk shaped anode 105 positioned therein. The anode 105, which is generally a disk shaped copper member, i.e., a soluble-type copper anode generally used to support copper electrochemical plating operations, generally includes a plurality of parallel positioned anode slots 107 formed therein. The anode slots 107 generally extend through the interior of anode 105 and are in fluid communication with both the upper surface and lower surface of anode 105, as illustrated in the cross section of anode 105 in FIG. 1. As such, anode slots 107 allow fluids to travel through the interior of anode 105 from the upper surface to the lower surface of the anode 105. However, when anode 105 is positioned within annular recess 201 of base member 104, the parallel anode slots 107 of the anode 105 are generally positioned orthogonal to both anode base slots 204 and anode base channels 202 of base member 104, as illustrated cooperatively by FIGS. 2 and 3. Further, with regard to positioning, the anode slots 107 are generally positioned such that the tilt angle of the cell positions the slots orthogonal to fluid flow as a result of the tilt, i.e., the anode slots 107 are positioned such that fluid flowing across the surface of the anode 105 as a result of the tilt angle of the cell will intersect the anode slots 107 and be received therein. Although the inventors have illustrated the anode slots 107 being positioned orthogonally to the fluid flow, other fluid intersection angles, such as angles between about 5° and about 89°, are contemplated within the scope of the invention. Additionally, anode slots 107 generally do not continuously extend across the upper surface of anode 105. Rather, anode slots 107 are broken into a longer segment 303 and a shorter segment 304, with a conductive space 305 between the two segments, which operates to generate a longer current path through anode 105 from one side to the other (when the current path is measured orthogonal to the anode slots 107). Further, adjacently positioned anode slots 107 have the conductive spacer 305 positioned on opposite sides of the anode upper surface for each alternating anode slot 107. As such, the current path from the lower side of the anode 105 to the upper side of the anode 105 (orthogonal to the direction of the anode slots 107) generally includes a back and forth type path between the respective channels 107 through the spacer 305. Further, the positioning of spacers 305 and channels 107 provides for improved concentrated Newtonian fluid removal from the surface of the anode 105, as the positioning of channels 107 provides a shortest possible distance of travel for the dense fluids to be received in channels 107. This feature is important, as dense fluids generally travel slowly, and therefore, it is desirable.

In another embodiment of the invention anode 105 is manufactured from a bipolar insoluble electrode material. In this embodiment auxiliary electrode 132 may also be manufactured from a bipolar insoluble electrode material. In this embodiment anode 105 and auxiliary electrode 132 may be manufactured from platinum or other metal that is inert and operable as an anode material in an electrochemical plating solution. In this embodiment of the invention, a copper dosing system, such as a copper hydroxide dosing system, for example, may be used to replenish copper into the plating solution, i.e., the anolyte and catholyte of the plating cell, in place of the copper anode that supplies copper to conventional soluble anode plating cells. The auxiliary electrode 132 may be either consumable or a permanent part of the cell.

Referring to FIG. 1A, the plating cell 100 further includes a membrane support assembly 106 configured to support the membrane 108. The membrane support assembly 106 is generally secured at an outer periphery thereof to the base member 104, and includes an interior region that is configured to allow fluids to pass therethrough via a sequence of oppositely positioned slots, bores, or other fluid apertures (not shown). The membrane support assembly 106 may include an o-ring type seal (not shown) positioned near a perimeter of the membrane 108, wherein the seal is configured to prevent fluids from traveling from one side of the membrane 108 secured on the membrane support 106 to the other side of the membrane 108 without passing through the membrane 108 itself.

The implementation of the membrane between the anode and the substrate being plated generates substantially different behavior in the plating cell as compared to conventional plating cells, both without membranes and those with the membranes discussed in this application. Specifically, the behavior of a copper anode in an acid-free $CuSO_4$ solution is different from conventional anode behavior. First, the sludge formation rate is lower at current densities of up to about 60 $mA/cm^2$ than that in $CuSO_4/H_2SO_4$ electrolyte, especially at concentrations of less than about 0.5M. In more concentrated $CuSO_4$ solutions both the amount of sludge and the probability of anode passiviation increases, especially at low flow rates through the anode compartment. Further, although $Cu^+$ generally forms on the anode in both conventional tools and the tool of the invention, in the configuration of the present invention it accumulates only into the anolyte, mainly at current densities of greater than about 30 $mA/cm^2$, when the oxygen dissolved in electrolyte has no time to convert $Cu^+$ into $Cu^{2+}$ again. Further still, the stability of the anolyte and catholyte compositions decreases dramatically because of the small volumes of tanks.

Figure 4:
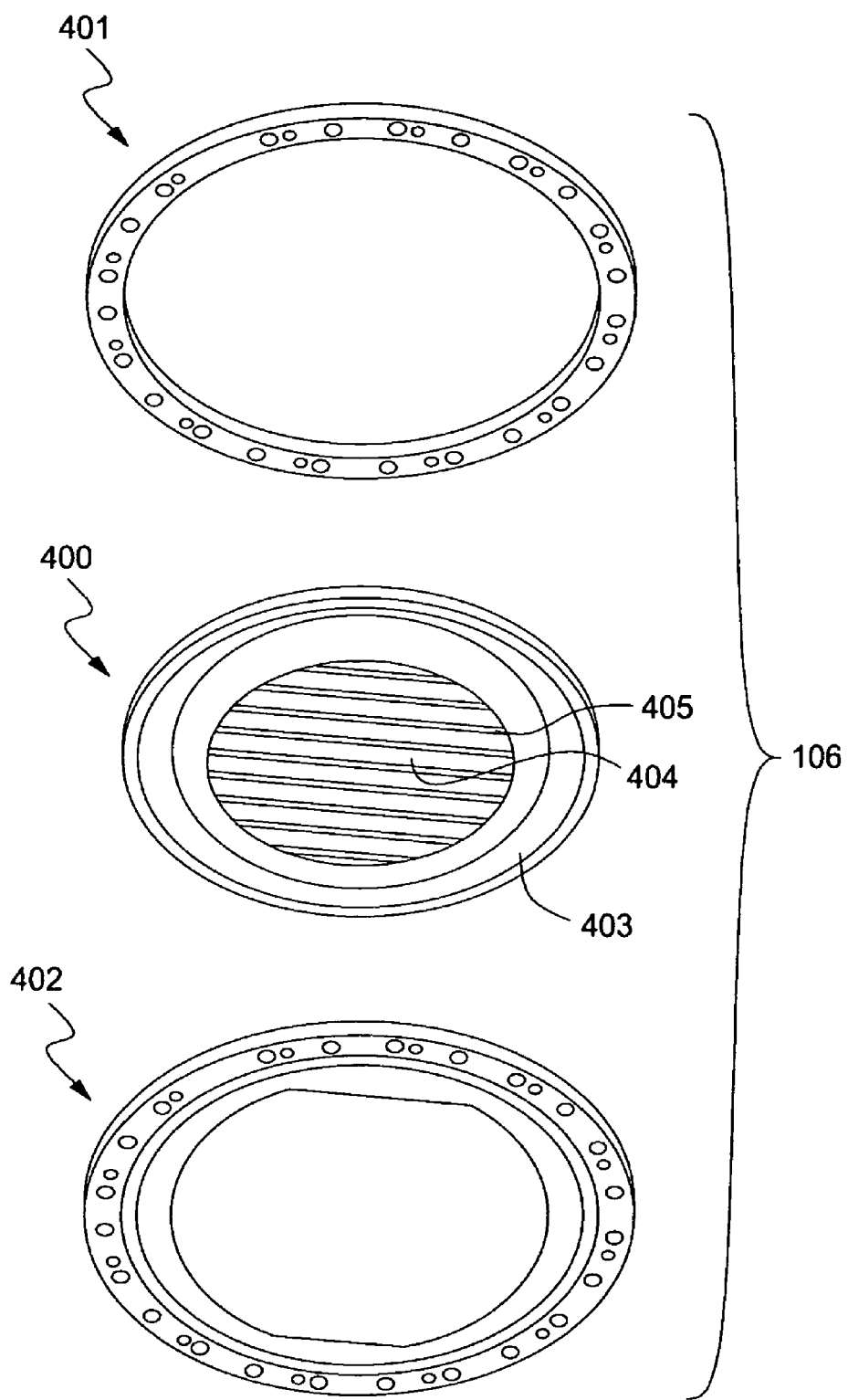
FIG. 4 illustrates an exploded perspective view of an exemplary membrane support member of the invention.

FIG. 4 illustrates an exploded perspective view of an exemplary membrane support assembly 106 of the invention. Membrane support assembly 106 generally includes an upper ring shaped support member 401, an intermediate membrane support member 400, and a lower support member 402. Upper and lower support members 401 and 402 are generally configured to provide structural support to intermediate membrane support member 400, i.e., upper support member 401 operates to secure intermediate membrane support member 400 to lower support member 402, while lower support member 402 receives intermediate membrane support member 400. Intermediate membrane support member 400 generally includes a substantially planar upper surface having a plurality of bores (not shown) partially formed therethrough. A lower surface of intermediate membrane support member 400 generally includes a tapered outer portion 403 and a substantially planar inner membrane engaging surface 404. An upper surface of lower support member 402 may include a corresponding tapered portion configured to receive the tapered section 403 of intermediate membrane support member 400 thereon. The membrane engaging surface 404 generally includes a plurality of parallel positioned/orientated channels (not shown). Each of the channels formed into the lower surface of intermediate membrane support member 400 are in fluid communication with at least one of the plurality of bores partially formed through the planar upper surface. The channels operate to allow a membrane positioned in the membrane support assembly to deform slightly upward in the region of the channels, which provides a flow path for air bubbles and less dense fluids in the cathode chamber to travel to the perimeter of the membrane and be evacuated from the anode chamber.

In operation, the plating cell 100 of the invention provides a small volume (electrolyte volume) processing cell that may be used for copper electrochemical plating processes, for example. Plating cell 100 may be horizontally positioned or positioned in a tilted orientation, i.e., where one side of the cell is elevated vertically higher than the opposing side of the cell, as illustrated in FIG. 1. If plating cell 100 is implemented in a tilted configuration, then a tilted head assembly and substrate support member may be utilized to immerse the substrate at a constant immersion angle, i.e., immerse the substrate such that the angle between the substrate and the upper surface of the electrolyte does not change during the immersion process, or alternatively, at an angle that varies during the immersion process. Further, the immersion process may include a varying immersion velocity, i.e., an increasing velocity as the substrate becomes immersed in the electrolyte solution and rotation of the substrate during the immersion process. The combination of the constant immersion angle, rotation, and the varying immersion velocity operates to eliminate air bubbles on the substrate surface.

Assuming a tilted implementation is utilized, a substrate is first immersed into a plating solution contained within inner basin 102. The immersion process generally includes positioning the substrate onto a cathode substrate support member or substrate contact ring. The substrate contact ring is generally configured to both support the substrate for electrochemical processing, as well as electrically contact the substrate to facilitate the electrolytic plating reaction. The electrical contact between the contact ring and the substrate is generally made via a plurality of electrically conductive contact pins positioned and configured to electrically engage a perimeter portion of the substrate and supply a plating bias to the substrate sufficient to support plating operations. Exemplary contact rings may be found in commonly assigned U.S. Pat. No. 6,136,163, filed on Mar. 5, 1999 and entitled Apparatus for Electrochemical Deposition with Thermal Anneal, commonly assigned U.S. Pat. No. 6,251,236, filed on Nov. 30, 1998 entitled Cathode Contact Ring for Electrochemical Deposition, and commonly assigned U.S. patent application Ser. No. 10/355,479, filed on Jan. 31, 2003 entitled Contact Ring with Embedded Flexible Contacts. All of the above noted cases illustrating contact rings are incorporated by reference herein in their entirety.

Once the substrate is immersed in the plating solution, which generally contains copper sulfate, a chlorine ion source, and one or more of a plurality of organic plating additives (levelers, suppressors, accelerators, etc.) configured to control plating parameters, an electrical plating bias is applied between a seed layer on the substrate and the anode 105 positioned in a lower portion of plating cell 100. The electrical plating bias generally operates to cause metal ions in the plating solution to deposit on the cathodic substrate surface. The plating solution supplied to inner basin 102 is continually circulated through inner basin 102 via fluid inlet/outlets 109 and conduits 206. More particularly, the plating solution may be introduced in plating cell 100 via a fluid inlet 109. The solution may travel across the lower surface of base member 104 and upward through one of fluid conduits 206.

The plating solution may then be introduced into the cathode chamber via a channel formed into plating cell 100 that communicates with the cathode chamber at a point above membrane support 106 and in fluid communication with conduits 206. Similarly, the plating solution may be removed from the cathode chamber via a corresponding fluid conduit 206. For example, as discussed above with respect to FIG. 2, anode base member 104 may include first and second fluid apertures 206 positioned on opposite sides of the anode base member 404. The oppositely positioned fluid apertures 206 may operate to individually introduce and drain the plating solution from the cathode chamber in a predetermined direction, which also allows for flow direction control.

Once the plating solution is introduced into the cathode chamber, the plating solution travels upward through a diffusion plate 110. Diffusion plate 110, which is generally a ceramic or other porous disk shaped member, generally operates as a fluid flow restrictor to even out the flow pattern across the surface of the substrate. Further, the diffusion plate 110 operates to resistively damp electrical variations in the electrochemically active area of the anode or cation membrane surface, which has been shown to reduce plating uniformities. Additionally, embodiments of the invention contemplate that the ceramic diffusion plate 110 may be replaced by a hydrophilic plastic member, i.e., a treated polyethylene (PE) member, a polyvinylidene (PVDF) member, a polypropylene (PP) member, or other material that is known to be porous and provide the electrically resistive damping characteristics provided by ceramics. However, the plating solution introduced into the cathode chamber, which is generally a plating catholyte solution, i.e., a plating solution with additives, is not permitted to travel downward through the membrane (not shown) positioned on the lower surface 404 of membrane support assembly 106 into the anode chamber, as the anode chamber is fluidly isolated from the cathode chamber by the membrane. The anode chamber includes separate individual fluid supply and drain sources configured to supply an anolyte solution to the anode chamber. The solution supplied to the anode chamber, which may generally be copper sulfate in a copper electrochemical plating system, circulates exclusively through the anode chamber and does not diffuse or otherwise travel into the cathode chamber, as the ionic membrane 108 positioned on membrane support assembly 106 is not fluid permeable in either direction.

Additionally, the flow of the fluid solution (anolyte, i.e., a plating solution without additives, which may be referred to as a virgin makeup solution) into the anode chamber is also directionally controlled in order to maximize plating parameters. For example, anolyte may be communicated to the anode chamber via an individual fluid inlet 109. Fluid inlet 109 is in fluid communication with a fluid conduit 205 formed into a lower portion of the anode base member. A seal positioned radially outward of conduits 205, in conjunction with the surrounding structure, directs the anolyte flowing out of conduits 205 upward and into anode base slots 204. Thereafter, the anolyte generally travels across the upper surface of the anode 105 towards the opposing side of base member 104, which in a tilted configuration, is generally the lower side of plating cell 100. The anolyte travels across the surface of the anode below the membrane positioned immediately above. Once the anolyte reaches the opposing side of anode 105, it is received into a corresponding fluid conduit 205 and drained from plating cell 104 for recirculation thereafter.

During plating operations, the application of the electrical plating bias between the anode and the cathode generally causes a breakdown of the anolyte solution contained within the anode chamber. More particularly, the application of the plating bias operates to generate multiple hydrodynamic or Newtonian layers of the copper sulfate solution within the anode chamber. The hydrodynamic layers generally include a layer of concentrated copper sulfate positioned proximate the anode, an intermediate layer of normal copper sulfate, and a top layer of lighter and depleted copper sulfate proximate the membrane. The depleted layer is generally a less dense and lighter layer of copper sulfate than the copper sulfate originally supplied to the anode compartment, while the concentrated layer is generally a heavier and denser layer of copper sulfate having a very viscous consistency. The dense consistency of the concentrated layer proximate the anode causes electrical conductivity problems (known as anode passivation) in anodes formed without anode slots 107. However, anode slots 107, in conjunction with the tilted orientation of plating cell 100, operate to receive the concentrated viscous layer of copper sulfate and remove the layer from the surface of the anode, which eliminates conductivity variances. Further, as noted above, plating cell 100 generally includes one side that is tilted upward or vertically positioned above the other side, and therefore, the upper surface of anode 105 is generally a plane that is also tilted. This tilt causes the layer of concentrated copper sulfate generated at the surface of the anode to generally flow downhill as a result of the gravitational force acting thereon. As the concentrated copper sulfate layer flows downward, it is received within one of anode slots 107 and removed from the surface of the anode 105. As discussed above, anode slots 107 are generally parallel to each other and are orthogonal to anode base channels 204. As such, each of anode slots 107 intersect several of anode base channels 202 at the lower surface of the anode 105. This configuration allows the concentrated copper sulfate received within anode slots 107 to be communicated to one or more of anode base channels 202. Thereafter, the concentrated copper sulfate may be communicated via anode base channels 202 to the annular drain channel 203 positioned within recessed portion 201. The drain 203 in communication with anode base channels 202 may generally be communicated through base plate 104 and back to a central anolyte supply tank, where the concentrated copper sulfate removed from the anode surface may be recombined with a volume of stored copper sulfate used for the anolyte solution. Similarly, the upper portion of anode chamber generates a diluted layer of copper sulfate proximate the membrane. The diluted layer of copper sulfate may be removed from the anode chamber via an air vent/drain 501, as illustrated in FIG. 5.

Figure 5:
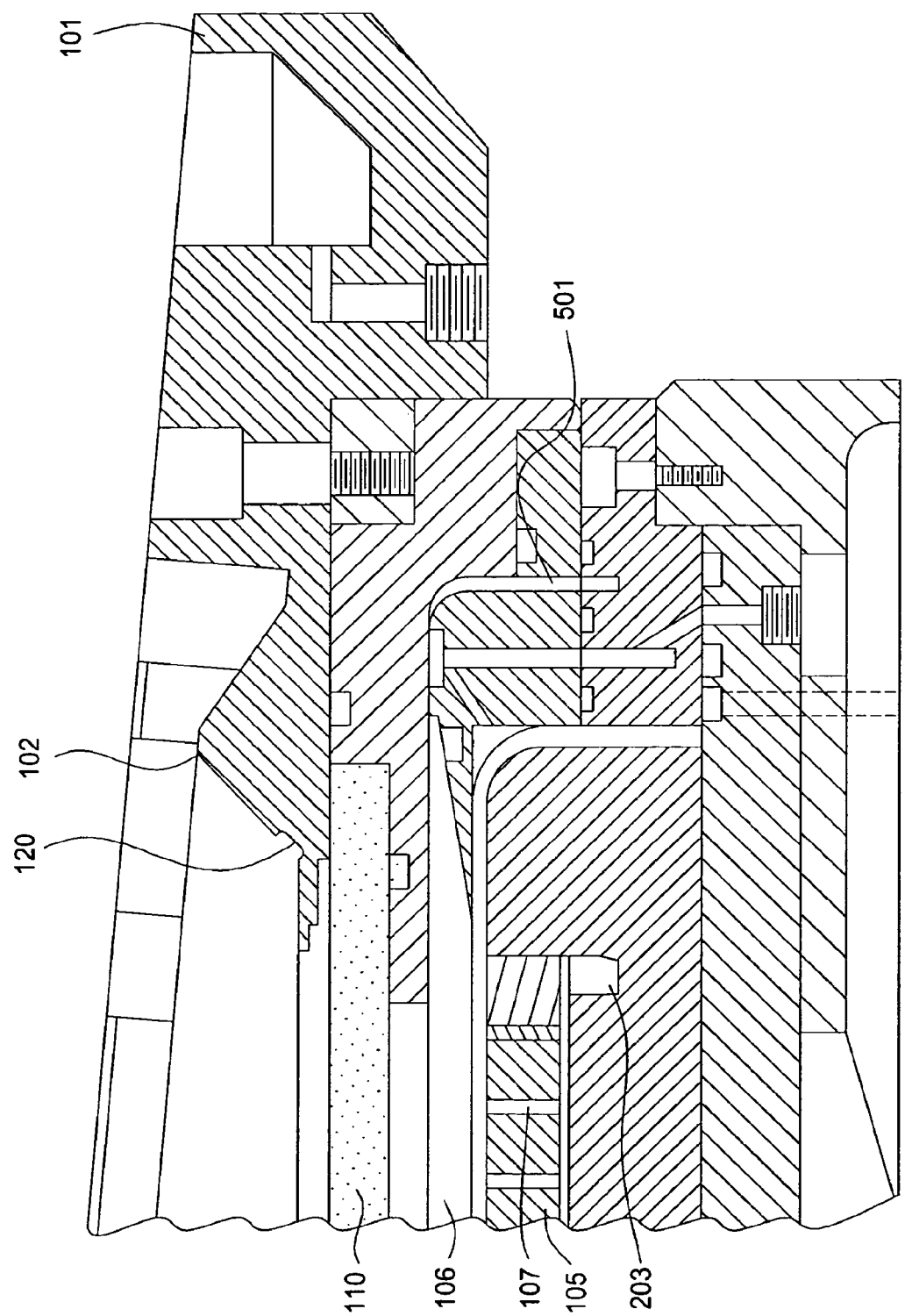
FIG. 5 illustrates a partial sectional view of an edge of the plating cell of the invention.

FIG. 5 shows a partial sectional view of an edge of the plating cell 100 showing a groove 120 where the encased auxiliary electrode assembly 130 (FIG. 1B) is generally positioned. The groove 120 is located in the lower portion of the inner basin 102. Air vent/drain 501, which may include multiple ports, is generally positioned on the upper side of electrochemical plating cell 100, and therefore, is positioned to receive both bubbles trapped within the anode chamber, as well as the diluted copper sulfate generated at the membrane surface. Air vents 501 are generally in fluid communication with the anolyte tank discussed above, and therefore, conducts the diluted copper sulfate received therein back to the anolyte tank, where the diluted copper sulfate may combine with the concentrated copper sulfate removed via anode slots 107 to form the desired concentration of copper sulfate within the anolyte tank. Any bubbles trapped by air vent 501 may also be removed from the cathode chamber vented to the atmosphere or simply maintained within the anolyte tank and not recirculated into the cathode chamber.

The catholyte solution (the solution used to contact and plate metal/copper onto the substrate) generally includes several constituents. The constituents generally include a virgin makeup plating solution or VMS (a plating solution that does not contain any plating additives, such as levelers, suppressors, or accelerators, such as that provided by Shipley Ronal of Marlborough, Mass. or Enthone, a division of *Cookson Electronics PWB Materials & Chemistry* of London), water (generally included as part of the VMS, but is may also be added), and a plurality of plating solution additives configured to provide control over various parameters of the plating process. The catholyte is generally a low acid-type of plating solution, i.e., the catholyte generally has between about 5 g/l of acid and about 50 g/l of acid, or more particularly, between about 5 g/l and about 10 g/l. The acid may be sulfuric acid, sulfonic acid (including alkane sulfonic acids), pyrophosphoric acid, citric acid, and other acids known to support electrochemical plating processes. The desired copper concentration in the catholyte is generally between about 25 g/l and about 70 g/l, preferably between about 30 g/l and about 50 g/l of copper. The copper is generally provided to the solution via copper sulfate, and/or through the electrolytic reaction of the plating process wherein copper ions are provided to the solution via the anolyte from a soluble copper anode positioned in the catholyte solution. More particularly, copper sulfate pentahydrate ($CuSO_4 \cdot 5H_2O$) may be diluted to obtain a copper concentration of about 40 g/l, for example. A common acid and copper source combination is sulfuric acid and copper sulfate, for example. The catholyte also has chlorine ions, which may be supplied by hydrochloric acid or copper chloride, for example, and the concentration of the chlorine may be between about 30 ppm and about 60 ppm.

As noted above, the plating solution (catholyte) generally contains one or more plating additives configured to provide a level of control over the plating process. The additives may include suppressors at a concentration of between about 1.5 ml/l and about 4 ml/l, preferably between about 2 ml/l and 3.0 ml/l. Exemplary suppressors include ethylene oxide and propylene oxide copolymers. Additives may also include accelerators at a concentration of between about 3 ml/l and about 10 ml/l, preferably within the range of between about 4.5 ml/l and 8.5 ml/l. Exemplary accelerators are based on sulfopropyl-disulfide or mercapto-propane-sulphonate and their derivatives. Additionally, another additive that may optionally be added to the catholyte solution is a leveler at a concentration of between about 1 ml/l and about 12 ml/l, or more particularly, in the range of between about 1.5 ml/l and 4 ml/l.

The anolyte solution, as noted above, is generally contained in the volume below the membrane and above the anode. The anolyte solution may be simply the catholyte solution without the plating additives, i.e., levelers, suppressors, and/or accelerators. However, the inventors have found that specific anolyte solutions, other than just stripped catholyte solutions, provide a substantial improvement in plating parameters. Specifically, copper transfer through the membrane and prevention of copper sulfate and hydroxide precipitation, i.e., when the Cu ions transport through membrane, copper sulfate accumulates in the anolyte and starts to precipitate on the anode provoking its passiviation, are improved. When pH of the anolyte is maintained above about 4.5 to about 4.8, copper hydroxide starts to deposit from Cu salt solutions, i.e., $Cu^{2+} + 2H_2O = Cu(OH)_2$ (deposit)$+2H^+$. More particularly, the inventors have found that if the anolyte can be configured to supply between about 90% and about 100% of the copper to the catholyte, then the membrane essentially operates as a clean copper anode, i.e., the membrane provides copper to the catholyte without the disadvantages associated with the electrochemical reaction that takes place at the surface of the anode (sludge formation, additive consumption, planarity variations due to erosion, etc.). The anolyte of the invention generally includes a soluble copper II salt (copper ions are not complexed with ligands like $NH_3$, or EDTA or phyrophoshoric acid anions, as Cu transports through the membrane together with this ligand, like $Cu(NH_3)_4^{2+}$ will transport together with $NH_3$, such as copper sulfate, copper sulfonate, copper chloride, copper bromide, copper nitrate, or a blend of any combination of these salts in an amount sufficient to provide a concentration of copper ions in the catholyte of between about 0.1M and about 2.5M, or more particularly, between about 0.25M and about 2M.

Additionally, the pH of the anolyte solution will generally be between about 1.5 and about 6, or more particularly, between about 2 and 4.8, for example. The pH is maintained in this range, as increasing the pH above this range in conventional plating configurations has been shown to cause copper hydroxide precipitation. Additionally, when the pH is below 2, and particularly if the pH is below 1.5, then the solution supports a substantial increase in the hydrogen ion ($H^+$) transport through the membrane from the anolyte to the catholyte. In this situation, the bulk of the plating current is carried by the $H^+$ ions and the copper ion transport is reduced. As such, the copper ion concentration in the catholyte decreases, potentially to a critical level that will not support plating, while simultaneously the sulfuric acid concentration in the catholyte increases. The anolyte can generally use any soluble $Cu^{2+}$ salt, such as $CuSO_4$ (solubility 300 g/L), $CuBr_2$ (solubility more that 2 kg/L), $CuCl_2$ (solubility 700 g/L), $CuF_2$ (47 g/L), $Cu(NO_3)_2$ (1300 g/L) etc. The selection of anions depends on their impact to prevent or minimize Cu(I) formation and anode passiviation, on penetration through the membrane etc. For instance, the anolyte can be $CuSO_4$ (0.5 M) with small additions of $Cu(NO_3)$ to activate anode surface and minimize Cu(I) formation. To minimize Cu(I) formation, small additions of $Cu(ClO_3)_2$ (solubility 2 kg/L) or $Cu(IO_3)_2$—solubility 1 g/L may be used. In similar fashion to the catholyte, the source of copper in the anolyte (aside from the anode) may be copper sulfate pentahydrate ($CuSO_4 \cdot 5H_2O$) at between about 51 g/L and 70 g/L, or at between about 0.75 M and about 0.95 M. Alternatively, in a preferred embodiment, the copper source may be between about 51 g/L and about 60 g/L, preferably about 54 g/L, and at a molarity of between about 0.8 M and about 0.9 M, preferably about 0.85 M.

Figure 6:
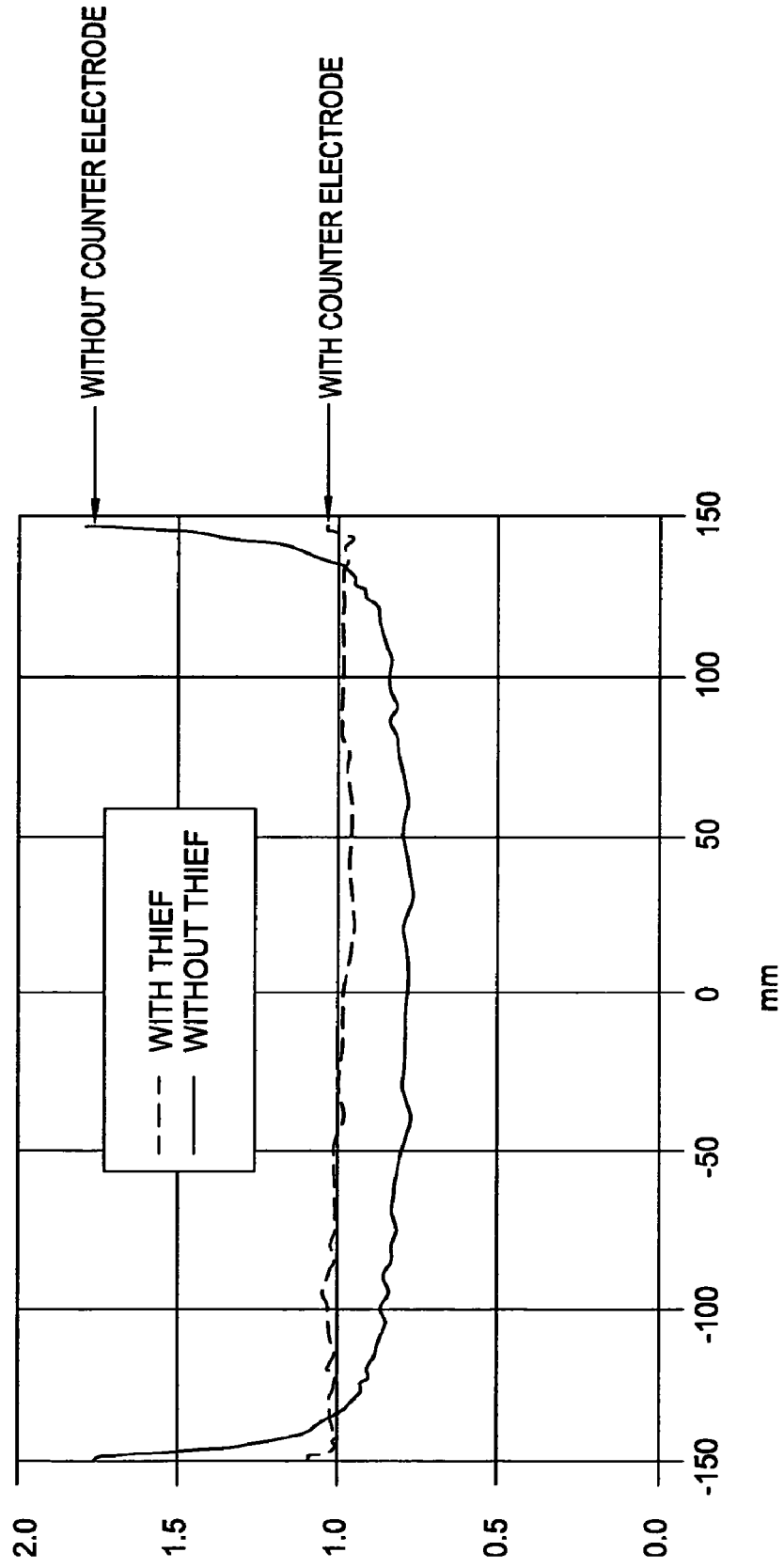
FIG. 6 illustrates a plating thickness plot for a plating cell with the encased auxiliary electrode assembly in fluid communication with the catholyte compared to a plating cell without the encased auxiliary electrode assembly.

FIG. 6 illustrates a plating thickness plot for a plating cell with the encased auxiliary electrode assembly in fluid communication with the catholyte compared to a plating cell without the encased auxiliary electrode assembly. The substrate plated had a diameter of 300 mm. This specific example is for 200 Å plated on a 300 Å Cu seed layer. The auxiliary electrode current for the "with auxiliary electrode" data is 0.4 A. The auxiliary electrode will work the same way for other seed layers, current densities, and plating thicknesses, but the auxiliary electrode current will vary.

The plating thickness plot of FIG. 6 results from the auxiliary electrode absorbing electric flux near the perimeter of the substrate. This essentially results in the anode electrically seeing a substrate that has a larger surface area than the substrate being plated and as such, the terminal effect is shifted to the auxiliary electrode assembly 130 from the perimeter of the substrate, i.e., the increased thickness near the perimeter is shifted to the auxiliary electrode and off or away from the perimeter of the substrate. Further, since the auxiliary electrode may be controlled, the deposition thickness near the perimeter of the substrate may also be controlled.

Figure 7:
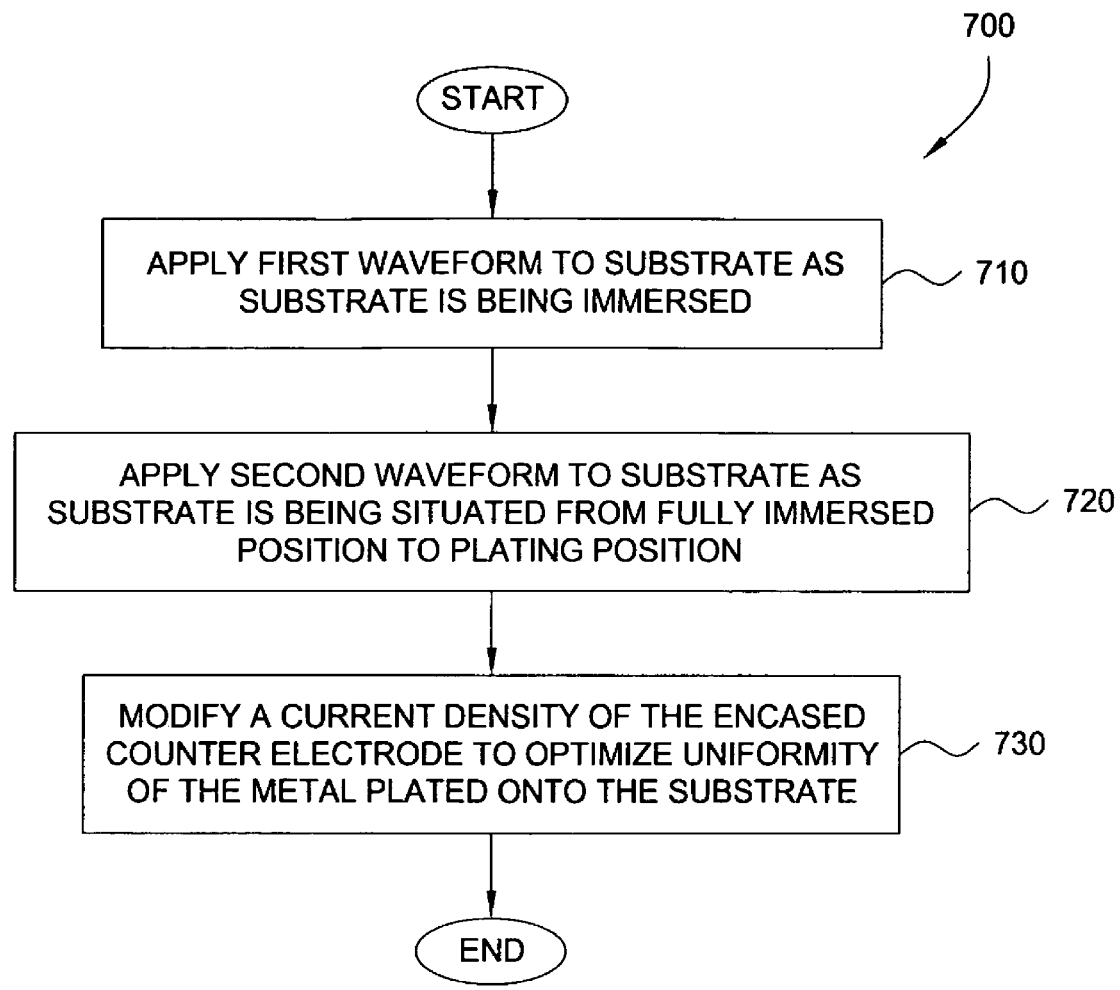
FIG. 7 illustrates a flow diagram of a method for immersing a substrate into a plating solution in accordance with one or more of the embodiments of the invention.

FIG. 7 illustrates a method for immersing a substrate into a plating solution in accordance with one or more of the embodiments of the invention. This method 700 involves modulating the current density applied to the substrate/wafer in a manner that is synchronized with the wafer's motion and exerting strict control of the current density uniformity across the wafer surface. This approach targets the first few seconds of plating (or the first 50 to about 100 Å of deposition) when features are filled.

The initial steps 710 and 720 involve development of an optimized waveform that is applied to the wafer during the initial seconds of plating including the immersion sequence. Details of the immersion sequence and waveform development are described in U.S. patent application Ser. No. 11/052, 443, entitled "Immersion Process For Electroplating Applications," assigned to Applied Materials, Inc., filed Feb. 7, 2005 and herein incorporated by reference to the extent not inconsistent with the invention. The waveform consists of several steps whose durations and amplitudes are tuned to protect the seed-layer induce bottom-up growth, and achieve void-free fill. The steps are closely synchronized with the trajectory of the wafer as it is immersed and moved into its final plating position.

The next step 730 involves dynamic control of the instantaneous current distribution on the wafer. This has been achieved by model-guided design of the plating cell 100 configuration, which includes a diffusion plate 110 and an encased auxiliary electrode 132 to compensate for the terminal effect and produce uniform distribution of the instantaneous current density during the stages of plating. Specifically, the auxiliary electrode 132 current is dynamically varied in tandem with the waveform applied to the wafer and the growing thickness of the deposit.

As discussed earlier, "terminal effect" causes difference in deposition rate between different points across a substrate. The severity of the "terminal effect" are generally determined by size of the substrate and thickness of a seed layer, or the deposited metal layer. Because the thickness of the deposited metal layer increases as a plating process goes on, the severity of "terminal effect" changes continuously, which may require the compensation of "terminal effect" to be dynamic or adjustable. For example, when the substrate's resistivity is high, it may be desirable to plate under "edge-thin" conditions to compensate for the severe terminal effect during the initial stages of plating. As the terminal effect disappears, it may become desirable to plate under uniform plating conditions. As the plating process is continues and the overburden is deposited, it may be desirable to plate under an edge-thin, edge-thick, or uniform condition or with a specific plating profile that is optimum for subsequent processes such as CMP.

In this invention, the plating profile on the substrate is adjusted over the course of the plating process by plating in an apparatus where the electric field varies significantly as a function of the position of the substrate. This allows the different plating profiles to be achieved by moving the substrate. In the examples below, the electric field is made to vary within the plating cell as a function of the substrate's height above a restrictor element, and the wafer is moved to different heights during the plating process to achieve the different desired profiles. It should be noted however that the dynamic adjustment of the substrate position during the plating process to access different plating profiles is a general concept applicable to any plating apparatus where the plating profile on the substrate can be made to vary substantially with the substrate's position.

Figure 8A:
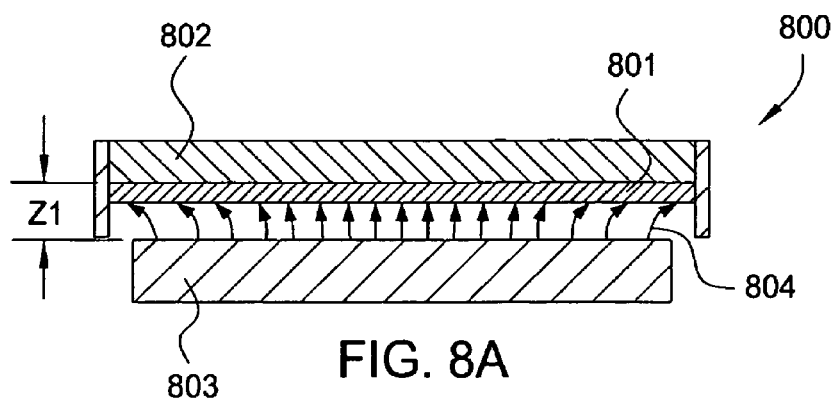
FIGS. 8A-8C schematically illustrate an electrochemical plating cell configured to provide an adjustable plating profile.
Figure 8B:
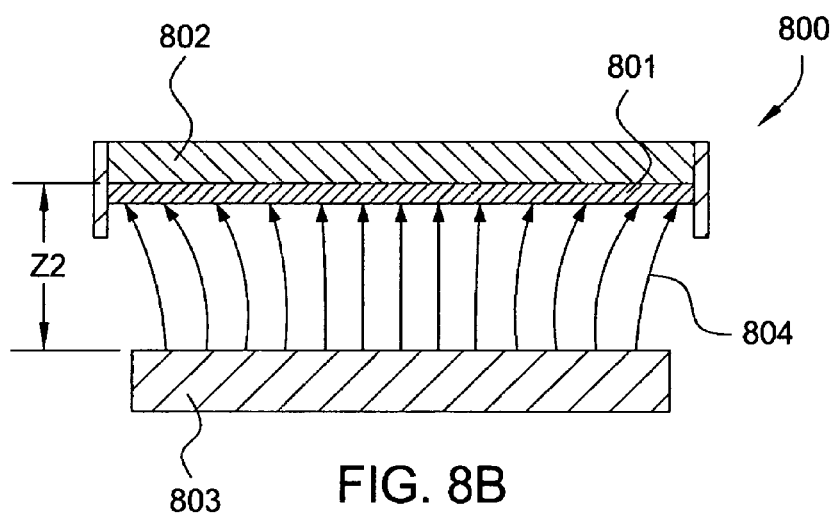
Figure 8C:
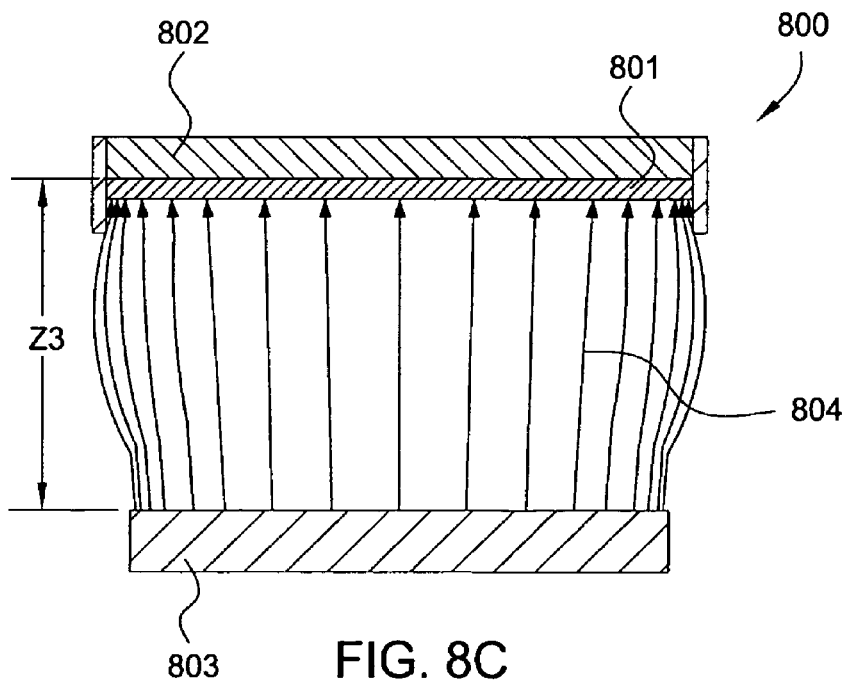

FIGS. 8A-8C schematically illustrate an electrochemical plating cell 800 configured to provide an adjustable plating profile. A substrate 801 is retained in a substrate support 802 configured to transfer the substrate 801 vertically. A restrictor 803 is disposed parallel to the substrate 801. The restrictor 803 has a diameter smaller than the diameter of the substrate 801. During process, the substrate 801 and the restrictor 803 are both immersed in a plating solution, and an electric field is applied to the substrate 801 via the restrictor 803. Curves 804 indicates the current density of the electric field.

FIGS. 8A-8C illustrate the substrate 801 has a vertical elevation Z1, Z2 and Z3 respectively relative to the restrictor 803, wherein elevation Z1 is the smallest and elevation Z3 is the largest. At elevation Z1, shown in FIG. 8A, the current density 804 on the surface of the substrate 801 has an edge thin pattern for the substrate 801 is close to the restrictor 803. At elevation Z3, shown in FIG. 8C, the current density 804 on the surface of the substrate 801 has an edge thick pattern for the substrate 801 is far away from the restrictor 803. At elevation Z2, shown in FIG. 8B, the current density 804 is relatively uniformly distributed on the surface of the substrate 801. Therefore, an edge thin plating profile may be achieved by positioning the substrate 801 at a low elevation, e.g., elevation Z1, an edge thick plating profile may be achieved by positioning the substrate 801 at a high elevation, e.g., elevation Z3, a uniform plating profile may be achieved by positioning the substrate 801 at a proper elevation, such as elevation Z2.

In one embodiment, the substrate 801 may be moved among different elevations during the plating process while the plating bias is being applied to the substrate 801 through the restrictor 803 having a smaller area than the substrate 801.

It should be noted that the restrictor 803 may be any means that functions as a means to restrict or "retain" the plating current within an area smaller than the plating surface on the substrate. Exemplary restrictor may be an anode with a smaller surface area than the substrate, or a diffuser plate with a smaller open area then the substrate, or part of a fluid basin having a smaller diameter than the rest of the fluid basin, or any means to restrict the path of plating electric field between the anode and the substrate.

Figure 9A:
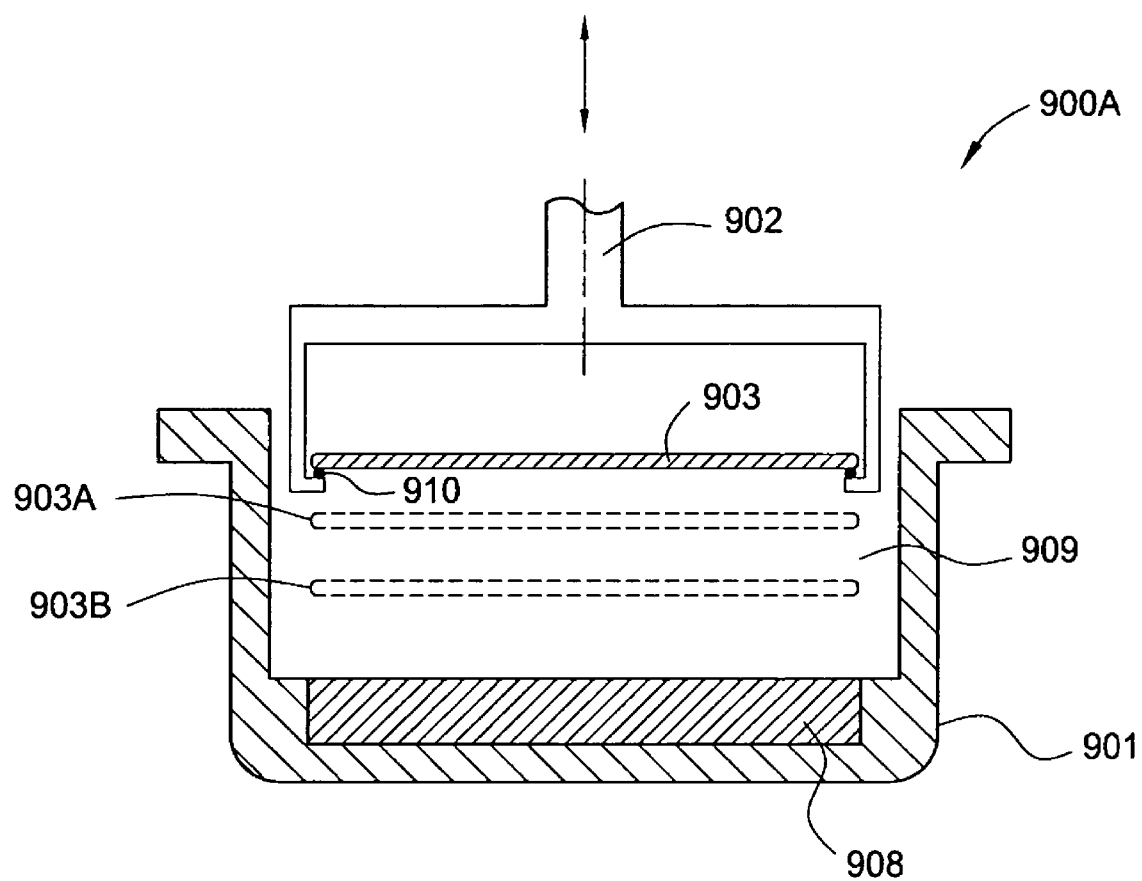
FIG. 9A illustrates a sectional view of an electrochemical plating cell having an anode smaller than the substrate.

FIG. 9A illustrates an electrochemical plating cell 900A configured to have an adjustable electric field across a substrate during a plating process. The plating cell 900A comprises a fluid basin 901 defining a fluid volume 909 configured to contain at least one electrolyte. The plating cell 900A further comprises a substrate support member 902 configured to support a substrate 903 therein. The substrate support member 902 contacts the substrate 903 via a plurality of conductive contact pins 910. The substrate support member 902 is further configured to move the substrate 903 and to spin the substrate 903 during process. An anode 908 is disposed in the fluid volume 909. The anode 908 may be a disk having a smaller diameter than the substrate 903. The substrate 903 may be moved vertically in the fluid volume 909, for example, into position 903A or 903B, during plating to achieve an edge thin, an edge thick or a uniform plating profile.

During different stages of a plating process, the substrate 903 may be moved to different elevations and/or biased by different waveforms to achieve a desired plating profile. For example, a first waveform may be applied to the substrate 903 from the substrate 903 first immersed into the plating solution until the substrate 903 reaches a first plating position. In one embodiment, the first waveform may be configured to prevent a seed layer on the substrate 903 from being depleted. Then a second waveform may be applied to the substrate 903 when the substrate 903 is in the first plating position. In one embodiment, the first plating position may have a low elevation relative to the anode 908, for example, position 903B, to generate an edge thin profile and the second waveform may be configured accordingly. The substrate 903 can then be moved to a second plating position and a third waveform may be applied to the substrate 903. In one embodiment, moving the substrate 903 from the first plating position to the second plating position may be conducted when the plated layer becomes thicker and the terminal effect becomes less severe. The second plating position may have a relative higher elevation compared to the first plating position, such as position 903A, therefore, providing a relatively uniform plating profile.

Figure 9B:
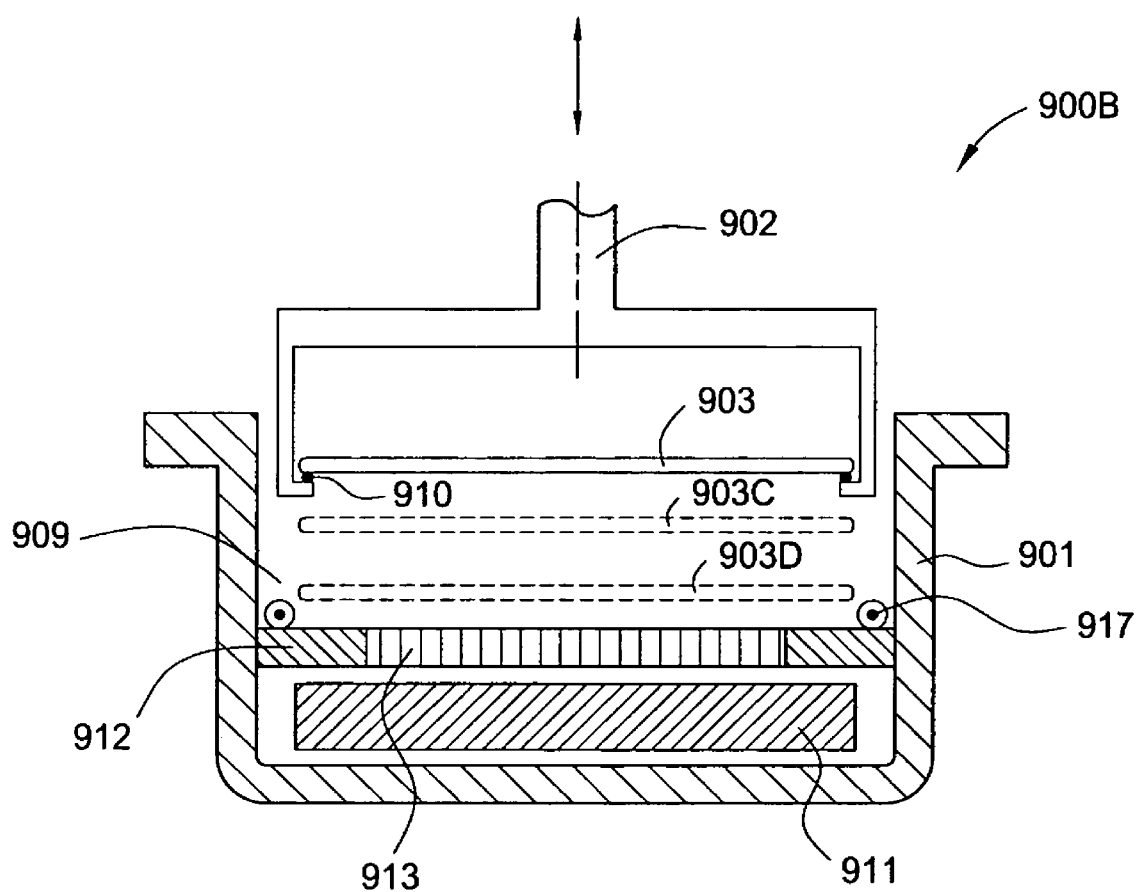

FIG. 9B illustrates an electrochemical plating cell 900B configured to have an adjustable electric field across a substrate during a plating process. An anode 911 is disposed near the bottom of the fluid volume 909 of the fluid basin 901. A diffuser plate 913 is placed above the anode 911. The diffuser plate 913 may be secured in place by a ring shaped support 912 extended from the fluid basin 901. The diffuser plate 913 may have a circular area to allow the plating solution inside the fluid volume 909 to pass through. The circular area may include a plurality of vertical channels to guide the flow of the plating solution in the fluid volume 909. The circular area is smaller than the surface area of the substrate 901. In one aspect, the diffuser plate 913 is configured to control the fluid flow in the fluid volume 909. In another aspect, the diffuser plate 913 also restricts the plating current within the circular area smaller than the substrate 901, which allows the plating profile to be adjusted by moving the substrate 901 vertically during the plating process. For example, the substrate 901 may be positioned at position 903D for an edge thin plating profile and be moved to position 903C for a more even plating profile compared to at position 903D.

Figure 9C:
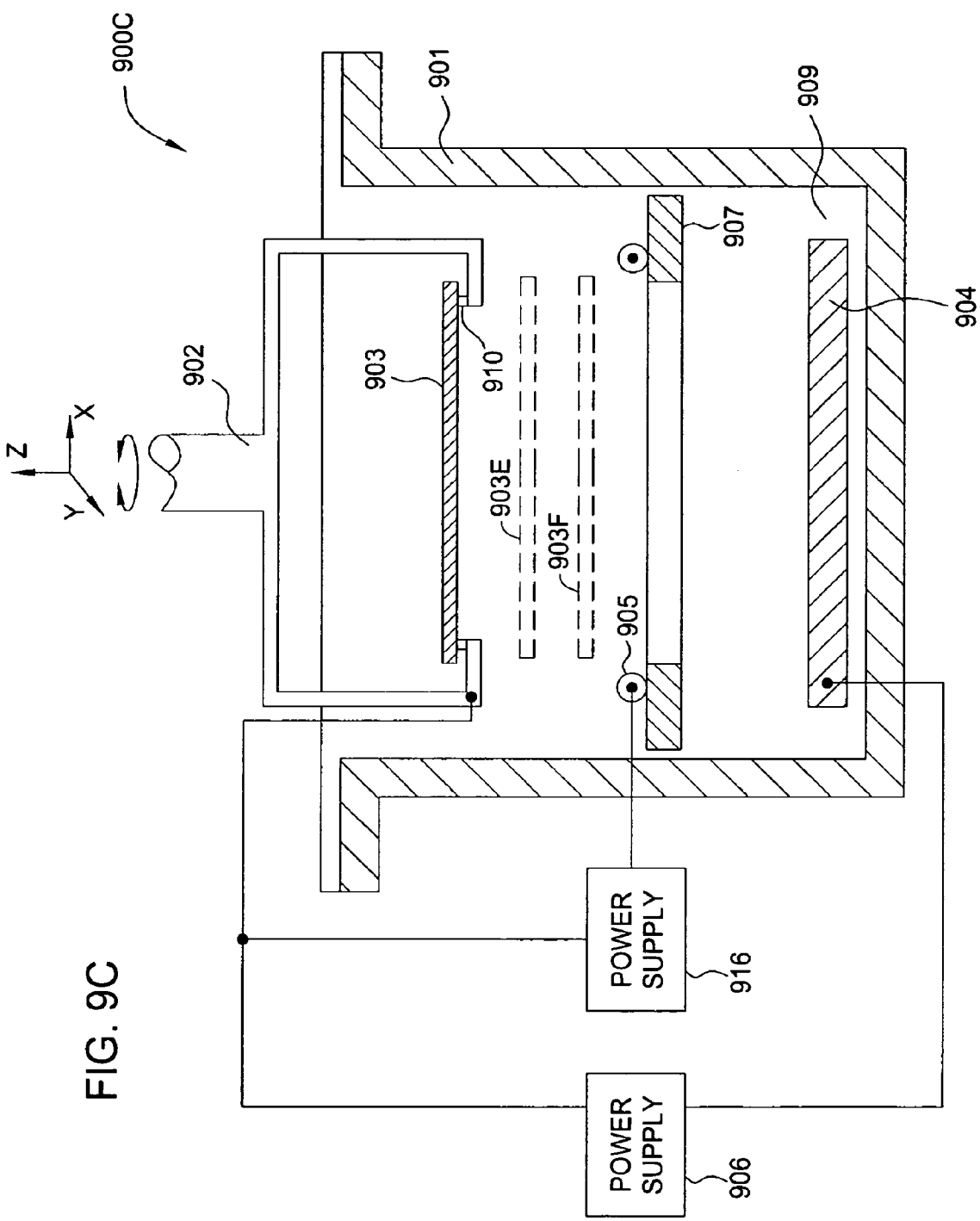
FIG. 9C illustrates a section view of an electrochemical plating cell having a shield and an auxiliary electrode.

FIG. 9C illustrates an electrochemical plating cell 900C configured to have an adjustable electric field across a substrate during a plating process. The substrate support member 902 contacts the substrate 903 via a plurality of conductive contact pins 910. An anode 904 is disposed near the bottom of the fluid basin 901. A power supply 906 is configured to apply an electric bias between the conductive contact pins 910 and the anode 904. An auxiliary electrode assembly 905 is disposed in the fluid basin 901. The auxiliary electrode assembly 905 is coupled to a power supply 916 which applies a bias to the auxiliary electrode 905 to adjust the electric field between the substrate 903 and the anode assembly 904. The plating cell 901 further comprises a shield 907 configured to shield part of the fluid volume 909 from being affected by the auxiliary electrode assembly 905. The shield 907 may be a ring having an inner diameter smaller than the outer diameter of the substrate 901.

In one embodiment, the auxiliary electrode 905 may be an encased electrode as described above. The auxiliary electrode 905 may be biased independently from the anode 904 and the substrate 903. The effect of the auxiliary electrode 905 may be adjusted by controlling the bias applied to the auxiliary electrode 905 and/or adjusting the distance between the substrate 903 and the auxiliary electrode 905.

The shield 907 further serves as a restrictor to retain the plating current between the anode 904 and the substrate 903. Therefore, the plating profile on the substrate 903 can be adjusted by moving the substrate 903 to change the elevation of the substrate 903 relative to the shield 907.

In this configuration, the plating profile may be changed by applying an appropriate bias to the auxiliary electrode in combination with positioning the substrate 903 at different elevations above the shield 907. As a result, a set of different plating profiles, which are not otherwise available, can be generated on the substrate 903, including edge-thin, edge thick or uniform, and other desirable plating profiles.

In another embodiment, an auxiliary electrode may be used in combination of a diffuser plate with a restricted area for fluid to pass through. For example, referring to FIG. 9B, an auxiliary electrode 917 may be disposed over the ring shaped support 912.

While the foregoing is directed to embodiments of the present invention, other and further embodiments of the invention may be devised without departing from the basic scope thereof, and the scope thereof is determined by the claims that follow.

What is claimed is:

1. An apparatus for electroplating a substrate, comprising:
   a fluid basin comprising:
      an outer basin; and
      an inner basin positioned within the outer basin, wherein a plating solution source is connected to the inner basin to continuously supply a plating solution to the inner basin, and the plating solution continuously overflows an uppermost point of the inner basin and is collected by the outer basin;
   an anode disposed near a bottom of the inner basin of the fluid basin;
   an auxiliary electrode positioned within the inner basin;
   a restrictor disposed above the anode; and
   a substrate support member configured to move the substrate within the fluid basin among different elevations relative to the restrictor, wherein the auxiliary electrode is disposed on the restrictor, the auxiliary electrode is encased in a protective tube comprising an ionic membrane, and the protective tube is positioned in a groove formed in a lower portion of the inner basin.

2. The apparatus of claim 1, further comprising an electrolyte source connected to the protective tube which retains an electrolyte therein.

3. An apparatus for electroplating a substrate, comprising:
   a fluid basin comprising:
      an inner basin configured to retain a plating solution in a fluid volume therein; and
      an outer basin, wherein the inner basin is disposed in the outer basin, the plating solution is continuously supplied the fluid volume of the inner basin, the plating solution continuously overflows an uppermost point of the inner basin and is collected by the outer basin;
   an anode disposed on a bottom of the inner basin of the fluid basin;
   an auxiliary anode disposed within in the inner basin; and
   a substrate support member configured to position the substrate in the inner basin of the fluid basin along a trajectory, wherein the fluid volume has a restricted section with an inner diameter smaller than the diameter of the substrate, wherein the auxiliary electrode is disposed approximate the restricted section, the auxiliary electrode is encased a protective tube comprising an ionic membrane, and the protective tube is positioned in a groove formed in a lower portion of the inner basin.

* * * * *

UNITED STATES PATENT AND TRADEMARK OFFICE
CERTIFICATE OF CORRECTION

| | | |
|---|---|---|
| PATENT NO. | : 7,846,306 B2 | Page 1 of 1 |
| APPLICATION NO. | : 11/362433 | |
| DATED | : December 7, 2010 | |
| INVENTOR(S) | : Hafezi et al. | |

It is certified that error appears in the above-identified patent and that said Letters Patent is hereby corrected as shown below:

In the Detailed Description of the Preferred Embodiment:

Column 4, Line 54, please delete "104" and insert --134-- therefor;

Column 5, Line 5, please delete "Protrective" and insert --Protective-- therefor;

Column 6, Line 42, please delete "190" and insert --180-- therefor;

Column 13, Line 10, please delete "404" and insert --204-- therefor;

Column 13, Line 33, please delete "404";

Column 13, Line 63, please delete "104" and insert --100-- therefor;

Column 15, Line 24, please delete "($C_u SO_4.5H_2O$)" and insert --($C_u SO_4 \cdot 5H_2O$)-- therefor;

Column 16, Line 38, please delete "($C_u SO_4.5H_2O$)" and insert --($C_u SO_4 \cdot 5H_2O$)-- therefor;

Column 19, Line 22, please delete "901" and insert --903-- therefor;

Column 19, Line 26, please delete "901" and insert --903-- therefor;

Column 19, Line 27, please delete "901" and insert --903-- therefor;

Column 19, Line 28, please delete "901" and insert --903-- therefor;

Column 19, Line 44, please delete "901" and insert --900C-- therefor;

Column 19, Line 48, please delete "901" and insert --903-- therefor.

Signed and Sealed this
Third Day of May, 2011

David J. Kappos
*Director of the United States Patent and Trademark Office*